United States Patent
Goodwin

(10) Patent No.: US 6,282,093 B1
(45) Date of Patent: Aug. 28, 2001

(54) LGA CLAMP MECHANISM

(75) Inventor: Jonathan W. Goodwin, Braintree, MA (US)

(73) Assignee: Thomas & Betts International, Inc., Sparks, NV (US)

( * ) Notice: Subject to any disclaimer, the term of this patent is extended or adjusted under 35 U.S.C. 154(b) by 0 days.

(21) Appl. No.: 09/330,402

(22) Filed: Jun. 11, 1999

(51) Int. Cl.⁷ .................................................. H05K 7/20
(52) U.S. Cl. ..................... 361/704; 165/80.2; 165/80.3; 165/185; 174/16.3; 257/718; 257/719; 361/710; 361/719; 361/720
(58) Field of Search ..................... 24/457–458, 295–298, 24/625; 165/80.2, 80.3, 185; 174/16.3; 257/707, 713, 717–718, 726–727; 248/505, 510; 361/704, 707, 709–710, 715, 719–721; 439/71, 91, 331, 485, 487

(56) References Cited

U.S. PATENT DOCUMENTS

| | | | |
|---|---|---|---|
| 4,460,223 | 7/1984 | Brown et al. | 339/14 R |
| 5,094,630 | 3/1992 | Jammet | 439/652 |
| 5,386,338 | 1/1995 | Jordan et al. | 361/704 |
| 5,428,897 | 7/1995 | Jordan et al. | 29/890.03 |
| 5,648,890 * | 7/1997 | Loo et al. | 361/704 |
| 5,653,768 | 8/1997 | Kania | 623/55 |
| 5,662,163 * | 9/1997 | Mira | 257/718 |
| 5,770,891 * | 6/1998 | Frankeny et al. | 257/727 |
| 5,771,155 | 6/1998 | Cook | 361/710 |
| 5,880,930 * | 3/1999 | Wheaton | 257/717 |
| 5,926,371 * | 7/1999 | Dolbear | 361/704 |

* cited by examiner

*Primary Examiner*—Gregory Thompson
(74) *Attorney, Agent, or Firm*—Weingarten, Schurgin, Gagnebin & Hayes LLP

(57) ABSTRACT

A Land Grid Array (LGA) clamp mechanism is presented. The mechanism includes a spring having a number of beams that mate with cooperating posts from a backing plate. The backing plate fits on the bottom side of a printed circuit board, opposite the area where a device is installed with the posts extending from the backing plate and through the printed circuit board. The LGA device is either inserted into a socket on the top side of the printed circuit board or mounted directly to the top side of the printed circuit board. A heat sink is placed directly on top of the LGA device. The posts from the backing plate extend through the circuit board and through the heatsink. A spring assembly is positioned along a top surface of the heatsink and is secured to the posts. The spring assembly includes a spring and a bias adjustment screw that is adjusted to provide a desired uniform amount of pressure to the heatsink, device and socket. Such a mechanism not only provides a uniform amount of pressure but also is additionally simple to install and adjust.

42 Claims, 33 Drawing Sheets

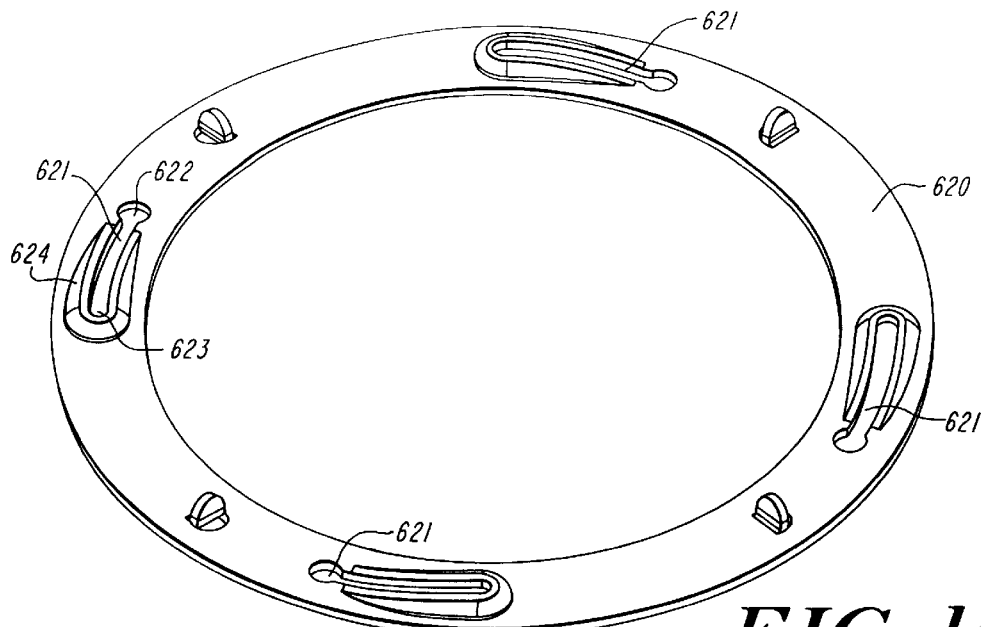
*FIG. 14*
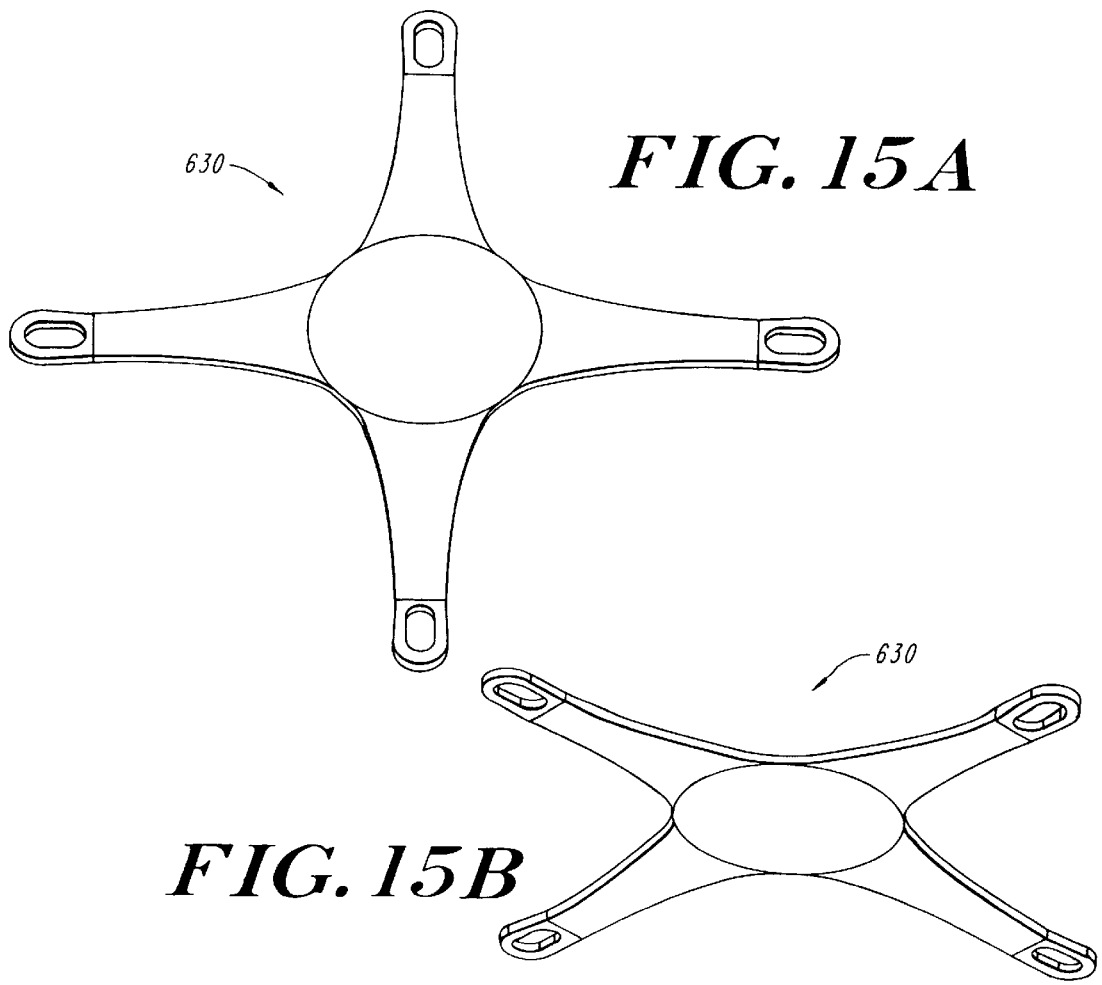
*FIG. 15A*
*FIG. 15B*

LGA CLAMP MECHANISM

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

Integrated circuits are being made which operate at increasingly faster speeds while taking up a minimal amount of space. As a result, these integrated circuits generate high amounts of heat that must be removed from the integrated circuit in order for the integrated circuit to operate at its maximum performance level. Typically a heatsink is coupled to the integrated circuit to aid in removing heat generated by the integrated circuit.

A variety of mechanisms have been utilized to secure a heatsink to an integrated circuit such as a Land Grid Array (LGA). The LGA device is typically situated in a socket on a printed circuit board and clamped in place with the heatsink. One prior art mechanism utilized a plurality of springs and screws to clamp the device between a socket and heatsink. Each screw was individually adjusted to provide proper biasing of the device within the socket and to provide a strong thermal conduction path between a surface of the heatsink and the device. A drawback associated with such a mechanism is the difficulty in providing uniform pressure to the heatsink, integrated circuit, and the socket. This mechanism is also difficult to assemble due in part to the numerous parts and alignment required. Additional attempts included the use of a combination of spring clamps and clips to secure the heatsink to the socket with the device positioned therebetween. This attempt required the use of a specialized socket and heatsink, and did not allow for adjustment of the tension between the heatsink, device and socket. It would be desirable to have a mechanism that can provide uniform pressure between a heatsink, device and socket and for such a mechanism to be simple to implement and low in cost.

BRIEF SUMMARY OF THE INVENTION

A Land Grid Array (LGA) clamp mechanism is presented. The mechanism includes a spring having a number of beams that mate with cooperating posts of a backing plate. The backing plate fits on the bottom side of a printed circuit board, opposite the area where a device is installed and with the posts extending from the backing plate through openings in the printed circuit board. The LGA device is either inserted into a socket on the top side of the printed circuit board or mounted directly to the top side of the printed circuit board. A heat sink is placed directly on top of the LGA device. The posts from the backing plate extend through the circuit board and through openings in the heatsink. A spring assembly is positioned along a top surface of the heatsink and is secured to the posts. The spring assembly includes a spring and a bias adjustment screw that is adjusted to provide a desired uniform amount of pressure to the heatsink, device and socket. A variety of spring and heatsink configurations may be used as part of the clamp mechanism. Such a mechanism not only provides a uniform amount of pressure but also is additionally simple to install and adjust.

BRIEF DESCRIPTION OF THE SEVERAL VIEWS OF THE DRAWING

The invention will be more fully understood from the following detailed description taken in conjunction with the accompanying drawings in which:

FIG. 14 is a view of the bias adjustment element of the clamp assembly of FIG. 13A;

FIG. 15A is a top perspective view of the spring of the clamp assembly of FIG. 13A;

FIG. 15B is a bottom perspective view of the spring of FIG. 15A;

DETAILED DESCRIPTION OF THE INVENTION

Figure 1A:
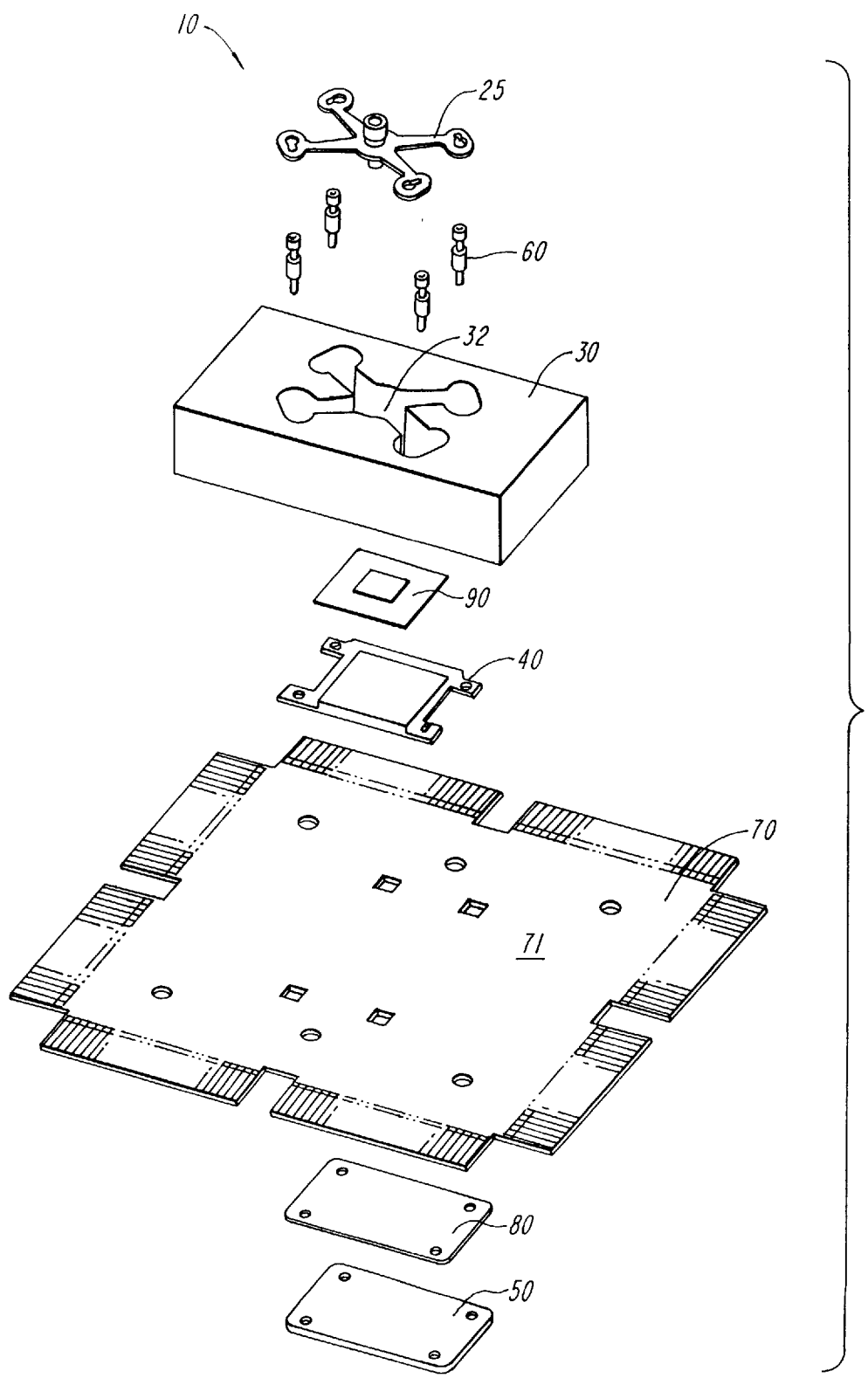
FIG. 1A is an exploded perspective view of the LGA clamp mechanism of the present invention.
Figure 1B:
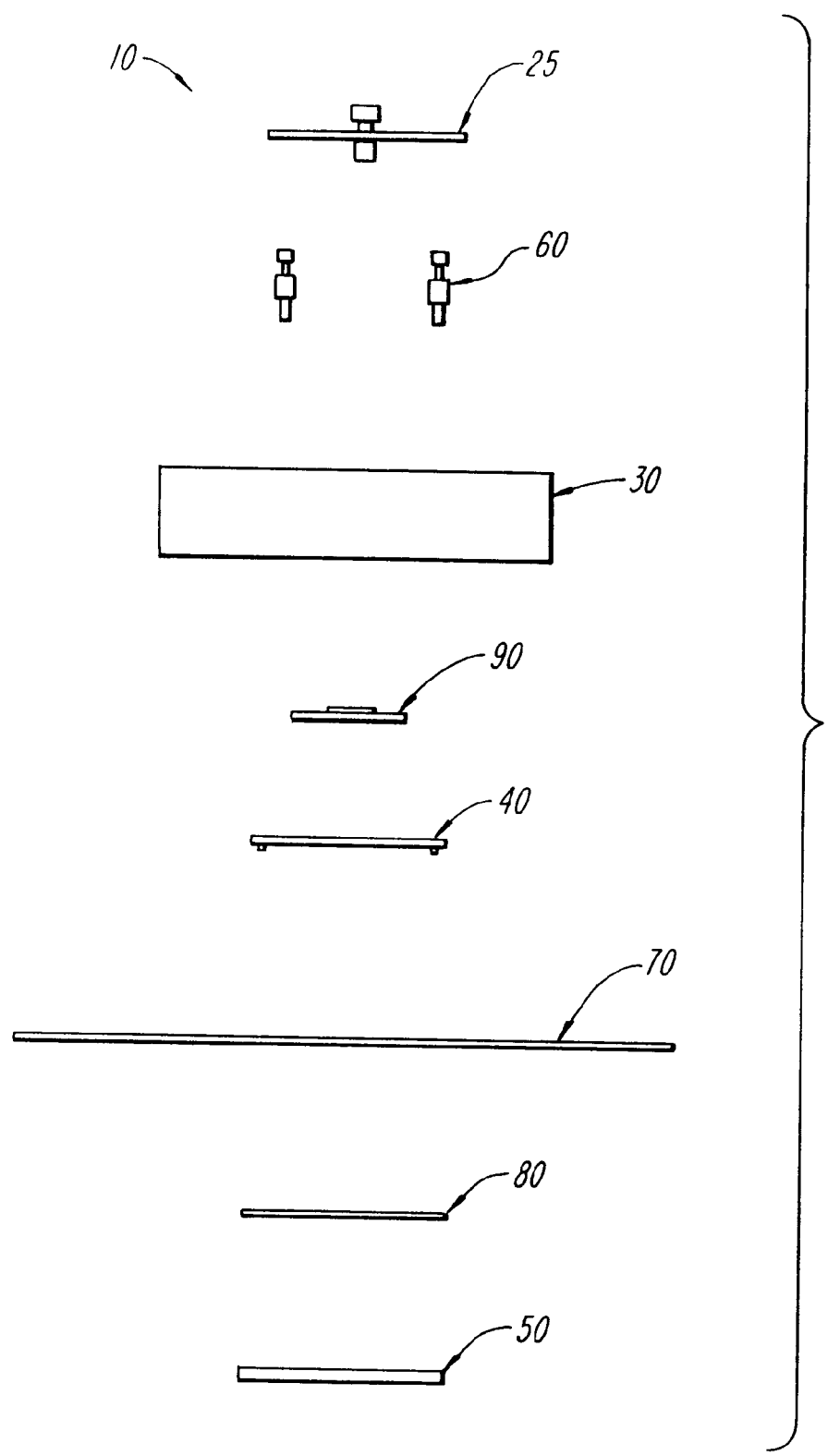
FIG. 1B is an exploded side view of the mechanism of FIG. 1.

A clamp mechanism that provides uniform pressure between a heatsink, integrated circuit and is disclosed. Referring to FIGS. 1A and 1B, the clamp mechanism 10 includes a spring assembly 25, a heatsink 30, a backing plate 50 and a plurality of posts 60.

Figure 2A:
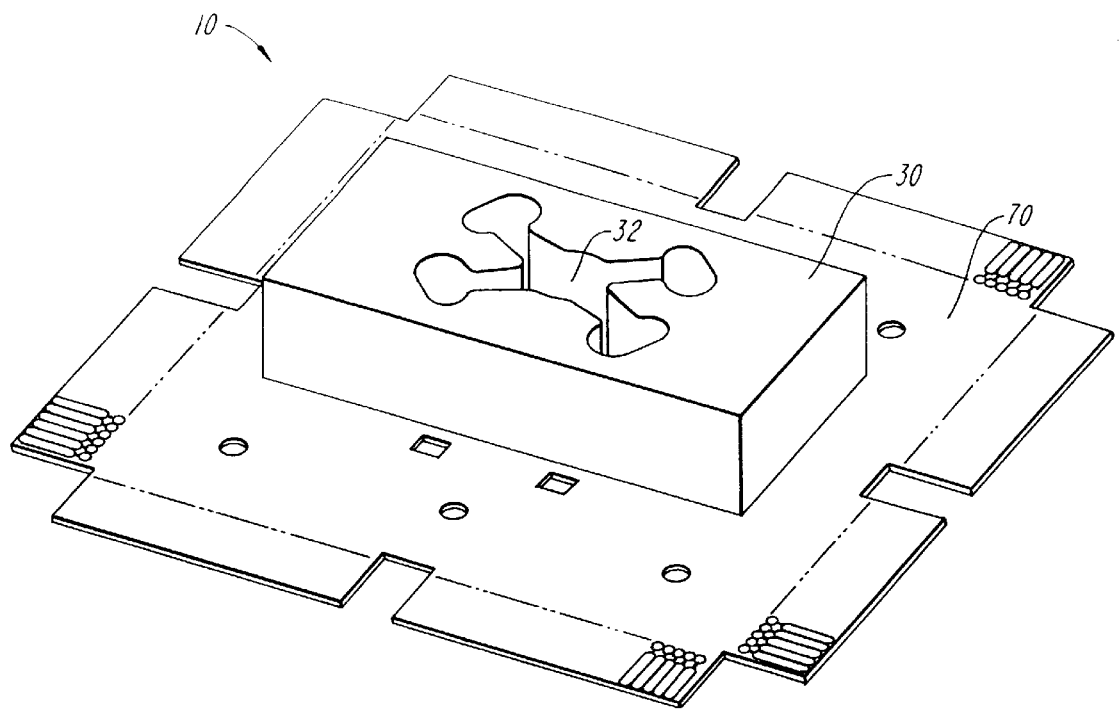
FIG. 2A is a perspective view of the assembled LGA clamp mechanism of the present invention.
Figure 2B:
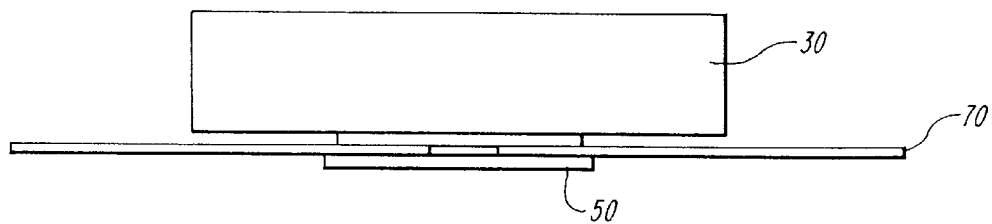
FIG. 2B is a side view of the mechanism of FIG. 2A.

Referring also to FIGS. 2A and 2B, the assembled clamp device 10 is shown. A printed circuit board 70 includes a socket 40 for an integrated circuit 90 such as a Land Grid Array (LGA) device mounted on a first side 71 thereof. Positioned underneath the printed circuit board 70 and opposite the area of the device socket is a backing plate 50. Backing plate 50 is comprised of a generally rigid material, such as steel. A backing plate insulator 80 may be positioned between the backing plate 50 and the printed circuit board 70 and provides for electrical insulation of the printed circuit board from the backing plate. The backing plate insulator is comprised of an insulative material such as Mylar.

Also shown are four posts 60 that extend from backing plate 50. While four are shown, it should be appreciated that any number of posts may be used. Posts 60 attach to backing plate 50, such as by being threadably received within backing plate 50, or may be attached to backing plate 50 by bronzing, soldering, welding, adhesive bonding or any other manner as would be known to those of reasonable skill in the art. The posts 60 could also be formed integrally with the backing plate. Posts 60 are comprised of generally rigid material such as steel. The posts 60 extend through circuit board 70 and into or through heatsink 30.

Referring back to FIGS. 1A and 2A, heatsink 30 is shown generally as a block of material such as aluminum. In this embodiment heatsink 30 also includes a generally X-shaped cavity 32 extending from a top surface of the heatsink. The cavity is configured to receive a spring assembly, discussed in detail below, therein. The cavity is also sized to allow the spring assembly to be moved from a first position wherein the spring assembly is disengaged from posts 60, to a second position wherein the spring assembly is engaged with posts 60.

Figure 3A:
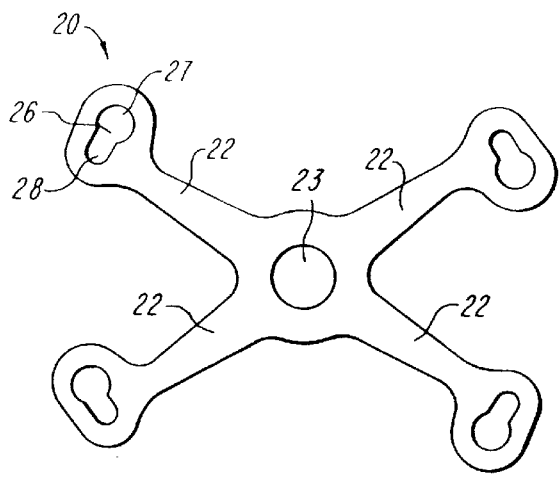
FIG. 3A is a top view of the spring of the LGA clamp mechanism.
Figure 3B:
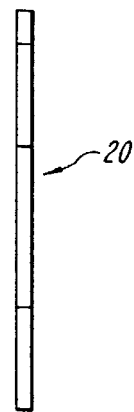
FIG. 3B is a side view of the spring of FIG. 3A.

Referring now to FIGS. 3A and 3B, spring 20 is shown. Spring 20 in this embodiment includes four beams 22 extending from a central area of the spring. A central bore 23 extends through the spring 20. Near the end of each beam 22 is a slotted opening 26. Slotted opening 26 includes a first circular opening 27 at a first end, and a second circular opening 28 at a second end. The first circular opening 27 is larger in diameter than second circular opening 28. Spring 20 is comprised of a generally rigid material such as steel.

Figure 4A:
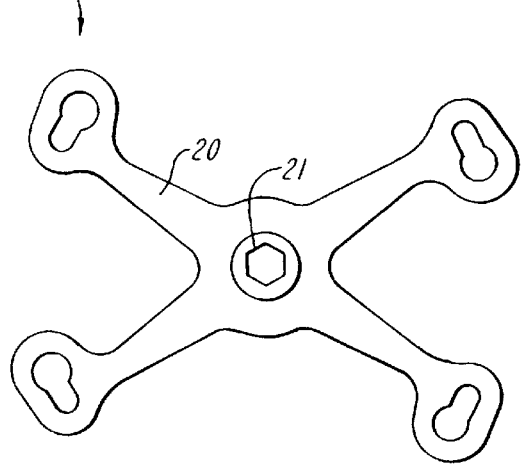
FIG. 4A is a top view of the spring assembly of the LGA clamp assembly.
Figure 4B:
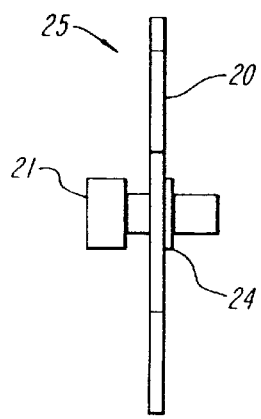
FIG. 4B is a side view of the spring assembly of FIG. 4A.

Spring assembly 25 is shown in FIGS. 4A and 4B. Spring assembly 25 includes the spring 20, described above. Spring assembly 25 further includes a threaded insert 24 disposed within the central bore of the spring 20. A spring bias adjustment screw 21 is threadably received and adjustable within threaded insert 24.

Figure 5:
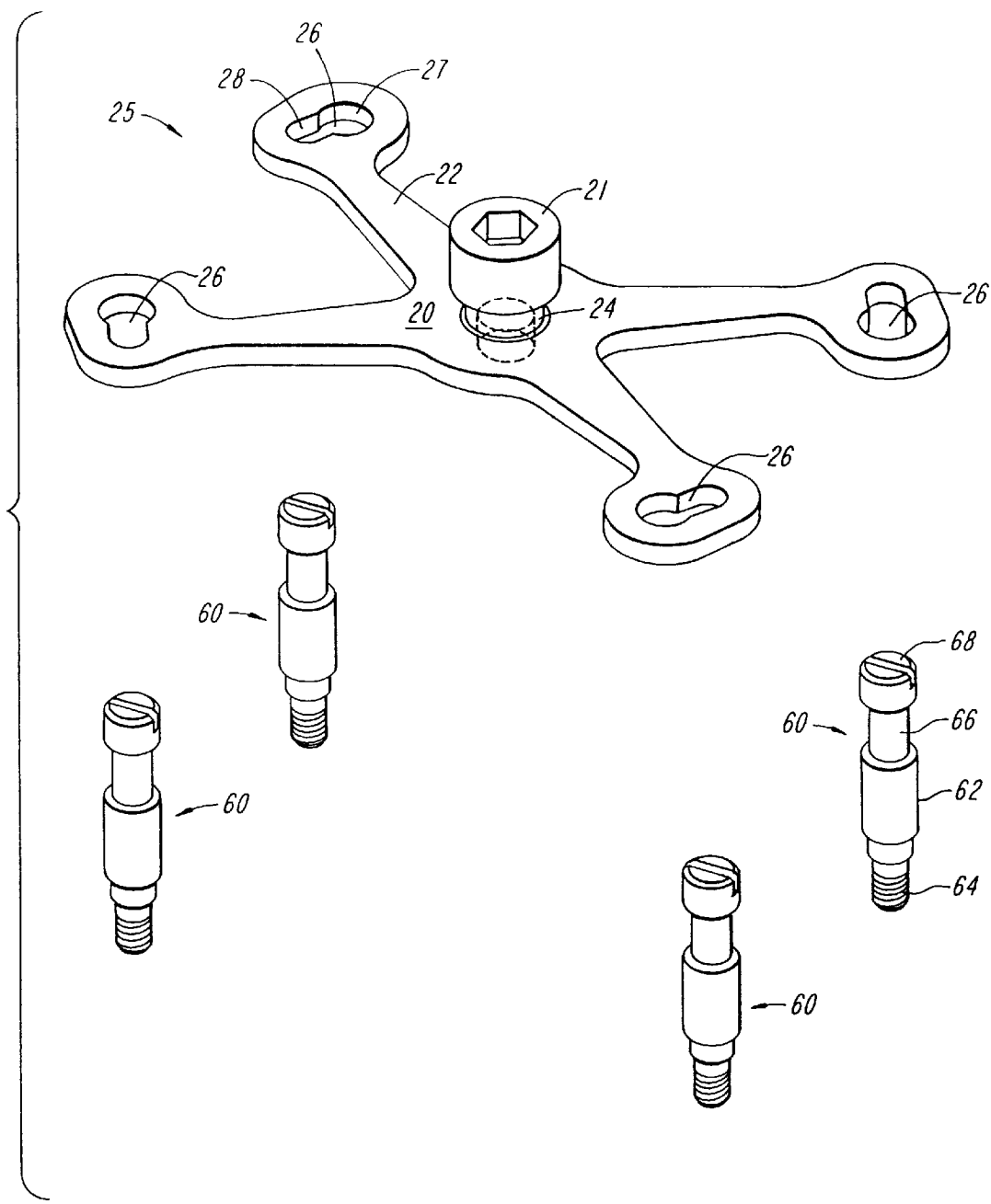
FIG. 5 is an exploded view of the spring assembly and posts of the LGA clamp assembly.

FIG. 5 shows spring assembly 25 and posts 60. Each post 60 includes a first end 64 that includes threads for securing the post to a backing plate. The posts further include a central shank 62, a reduced diameter portion 66 and a head 68.

The posts 60 are mated to the backing plate by being threaded into cooperating bores in the backing plate. The posts extend from the backing plate, through the printed circuit board and into the cavity of the heatsink. The spring assembly 25 is positioned within the cavity of the heatsink, such that the heads 68 of the posts 60 extend through the large diameter portions 27 of slots 26. The spring assembly 25 is then rotated in a clockwise direction, such that the narrow diameter portions 28 of slots 26 are positioned underneath the heads 68 of posts 60, and fit around a portion of the reduced diameter portions 66 of posts 60. The bias adjustment screw 21 is then turned such that an end of the screw 21 contacts the heatsink and forces the spring up against the bottoms of heads 68 of posts 60. As a result, by adjustment of a single screw the tension of the clamp is adjusted and provides the desired uniform bias between the spring, heatsink, and backing plate such that a uniform pressure is applied to the device 90 within the device socket 40 by the heatsink, spring assembly and backing plate.

Figure 6A:
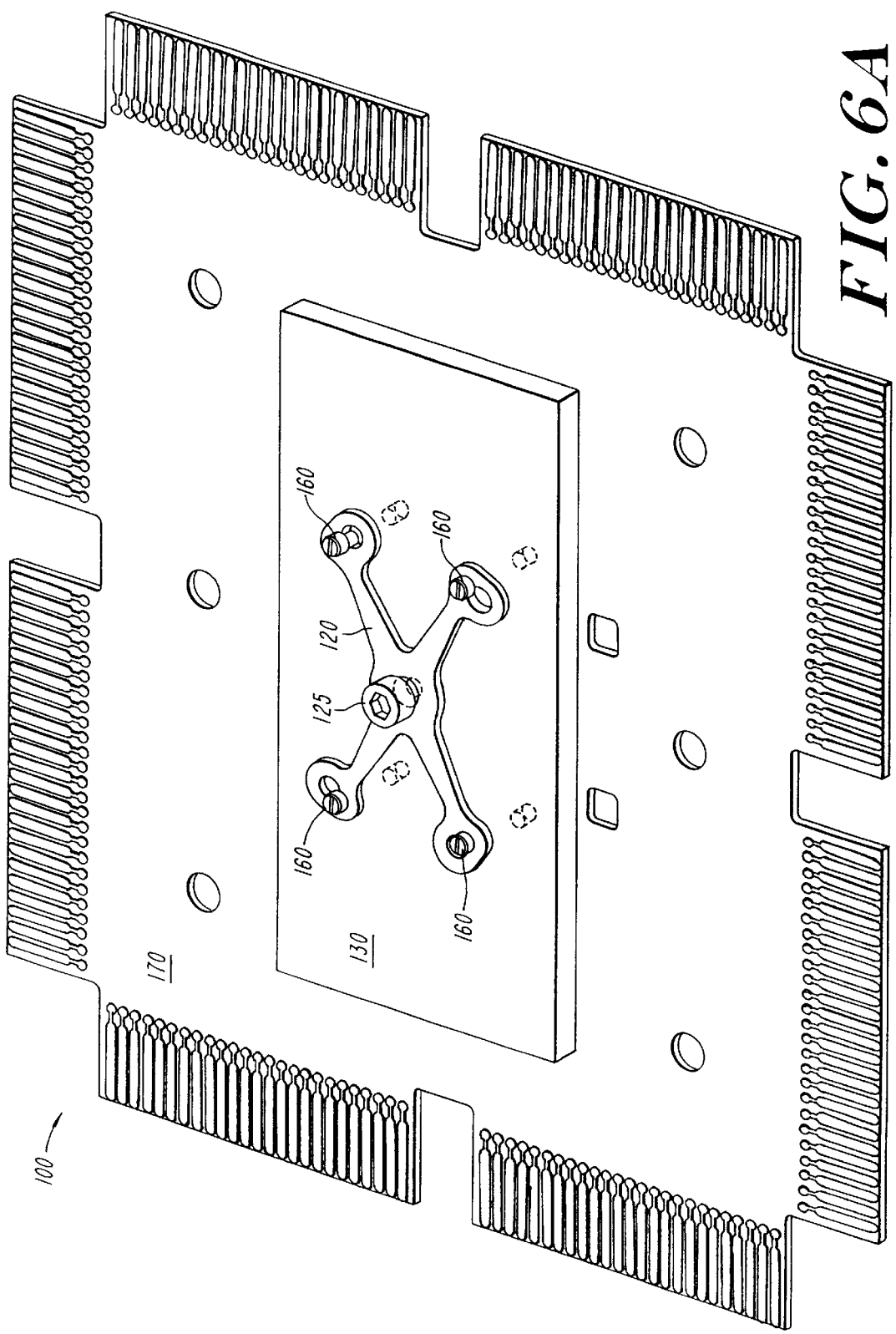
FIG. 6A is a perspective view of the an LGA clamp assembly including a low profile heatsink.
Figure 6B:
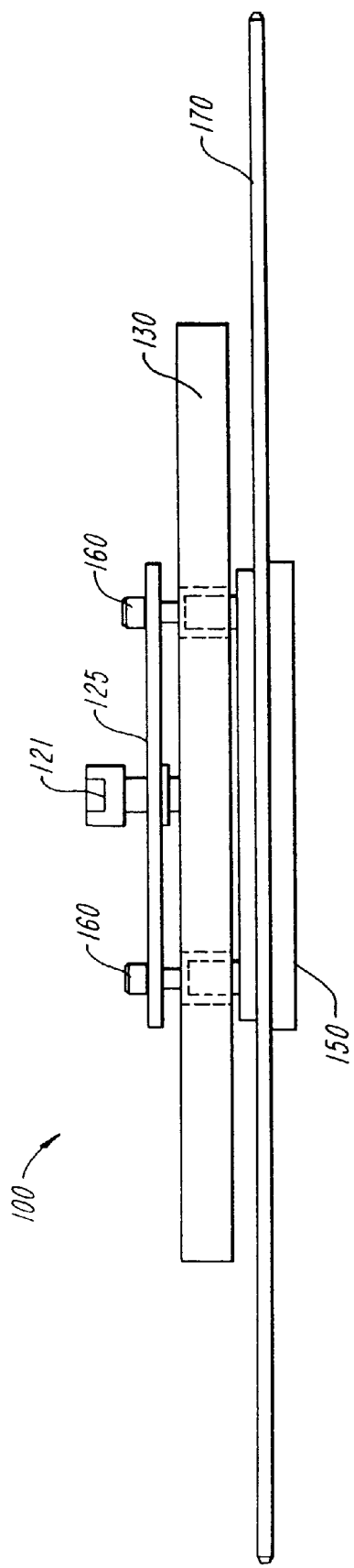
FIG. 6B is a side view of the LGA clamp assembly of FIG. 6A.

Referring now to FIGS. 6A and 6B, an embodiment 100 including a low profile heatsink 130 is shown. Spring assembly 125 in this embodiment also includes a spring 120 having four beams extending from a center of the spring and is similar to the spring described above. Spring assembly 125 also includes a threaded insert disposed within the central bore of the spring 120 and a spring bias adjustment screw 121 which is threadably received and adjustable within the threaded insert. The spring assembly is disposed along the top surface of the heatsink in this embodiment. The heatsink 130 is thinner than the heatsink shown in FIGS. 1A–2B, and as such a cavity for receiving the spring assembly is not required. The posts 160 extend from the backing plate 150 completely through heatsink 130 and are received by spring 120 of spring assembly 125. The spring 120 is rotated so the that the heads of the posts are captured, and the spring bias adjustment screw 121 is adjusted to provide the proper bias.

Figure 7A:
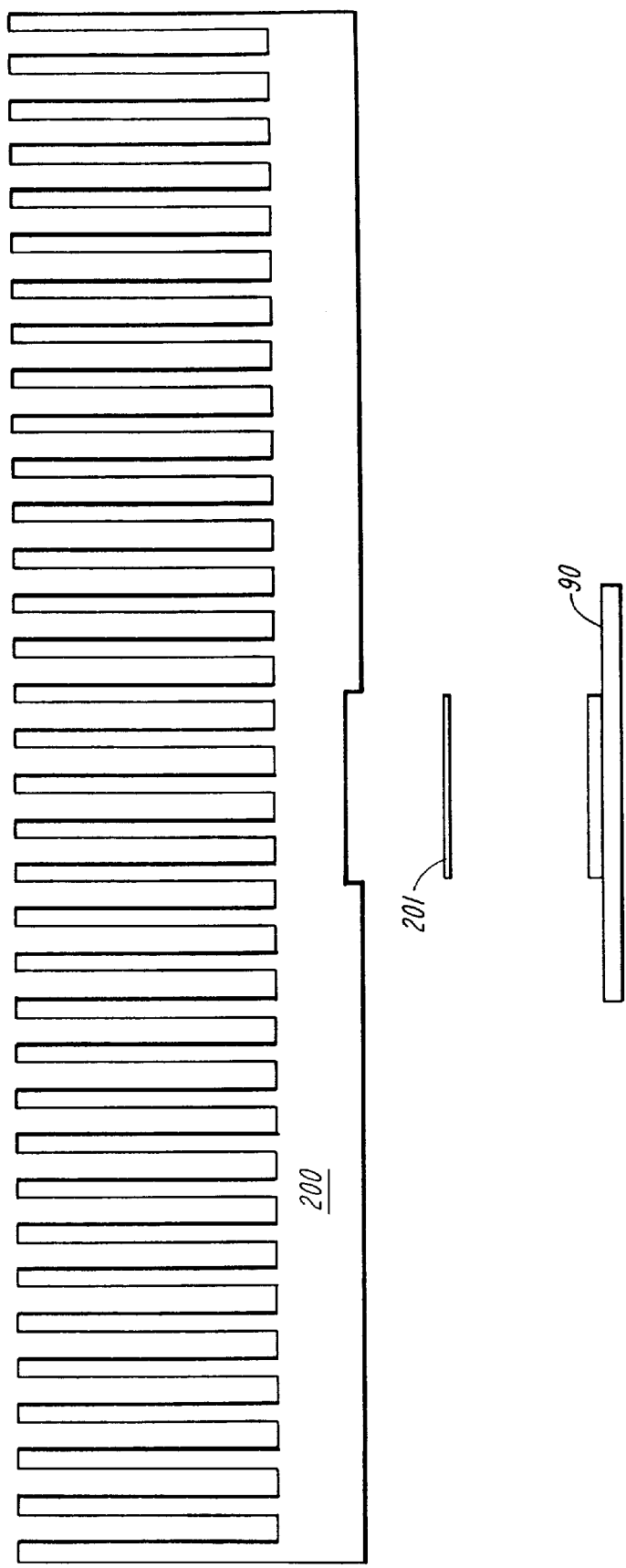
FIG. 7A is an exploded side view of a heatsink, device and thermal pad.
Figure 7B:
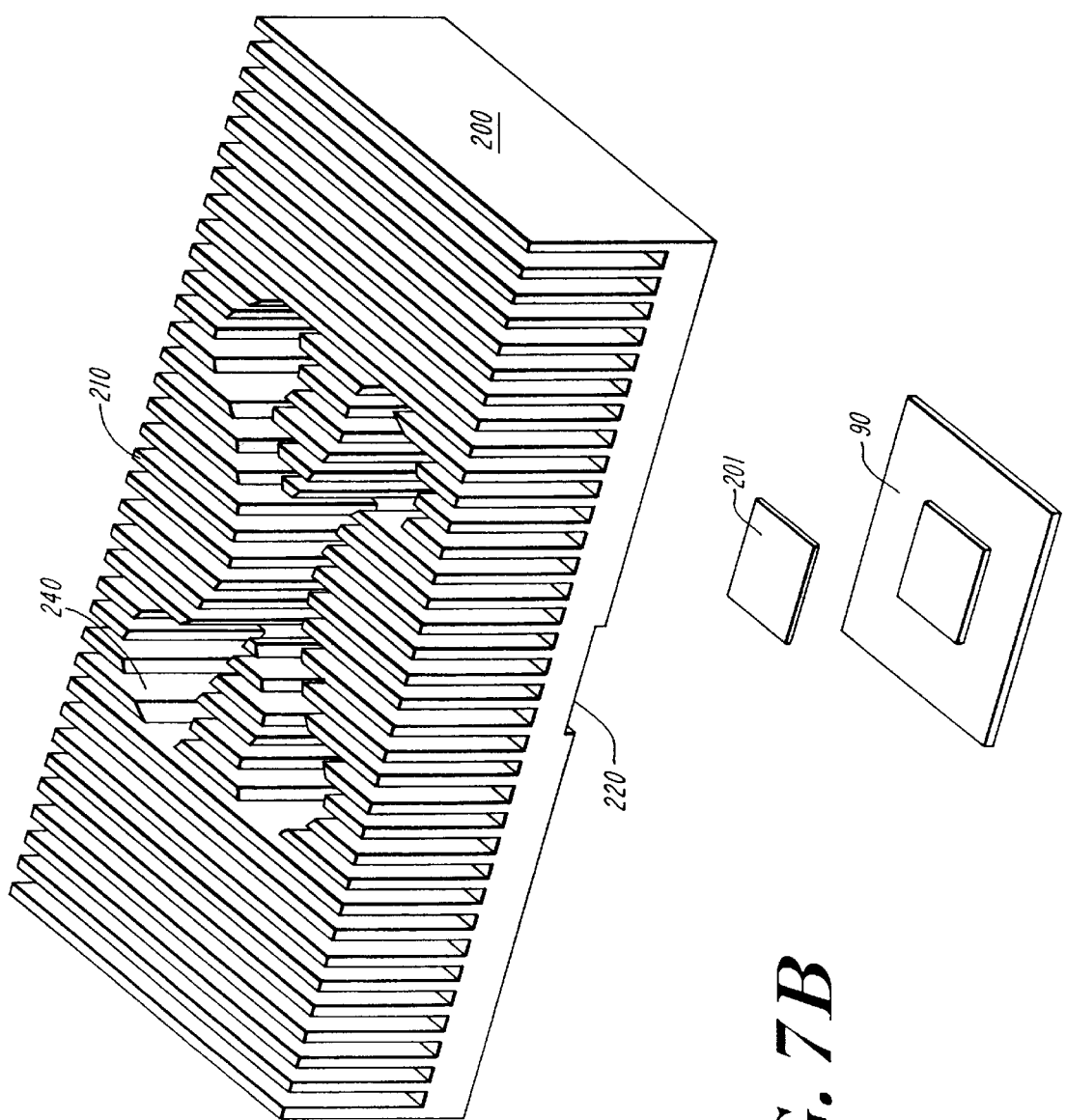
FIG. 7B is an exploded perspective view of the heatsink, device and thermal pad of FIG. 7A.
Figure 7C:
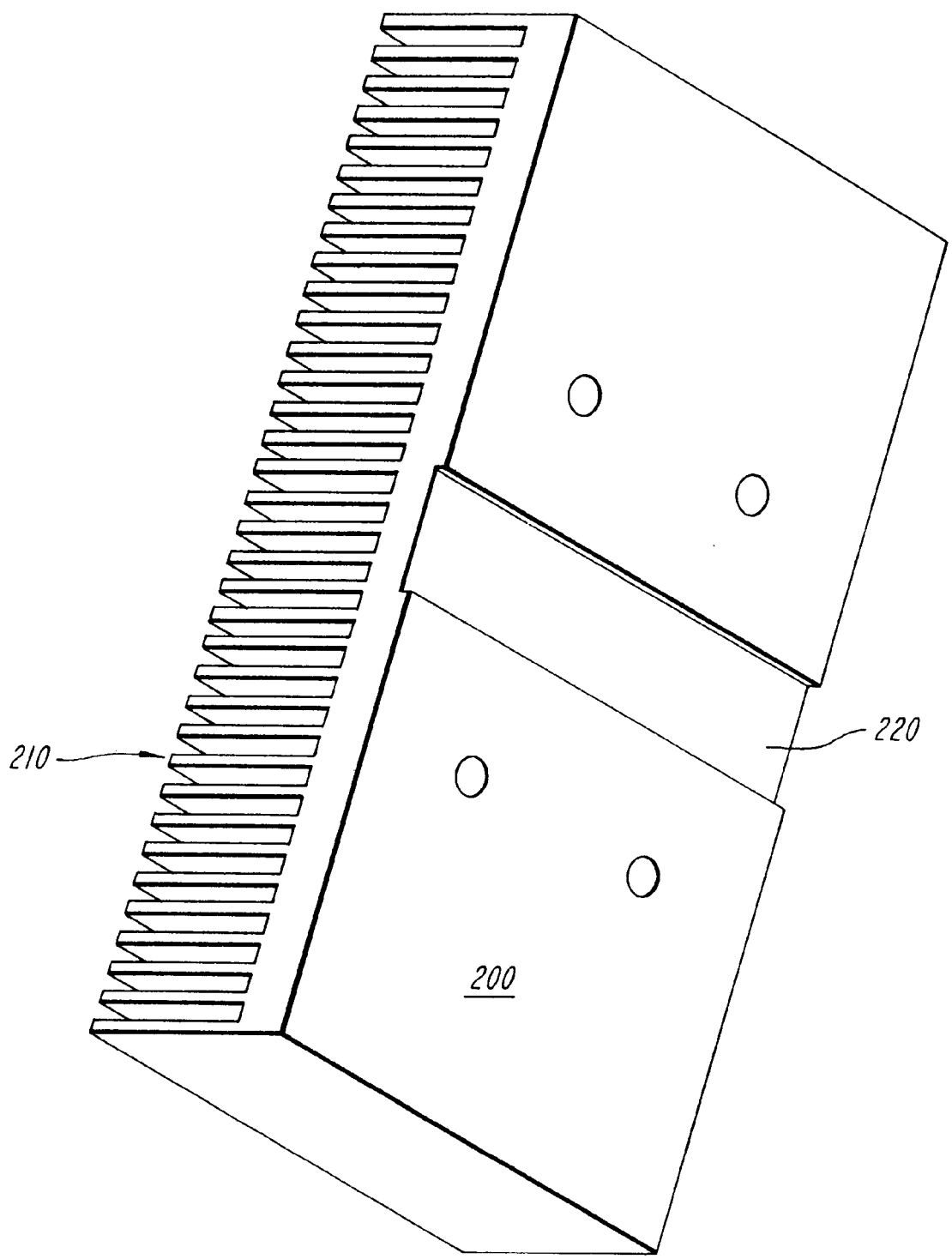
FIG. 7C is a perspective view of the heatsink of FIG. 7A.
Figure 7D:
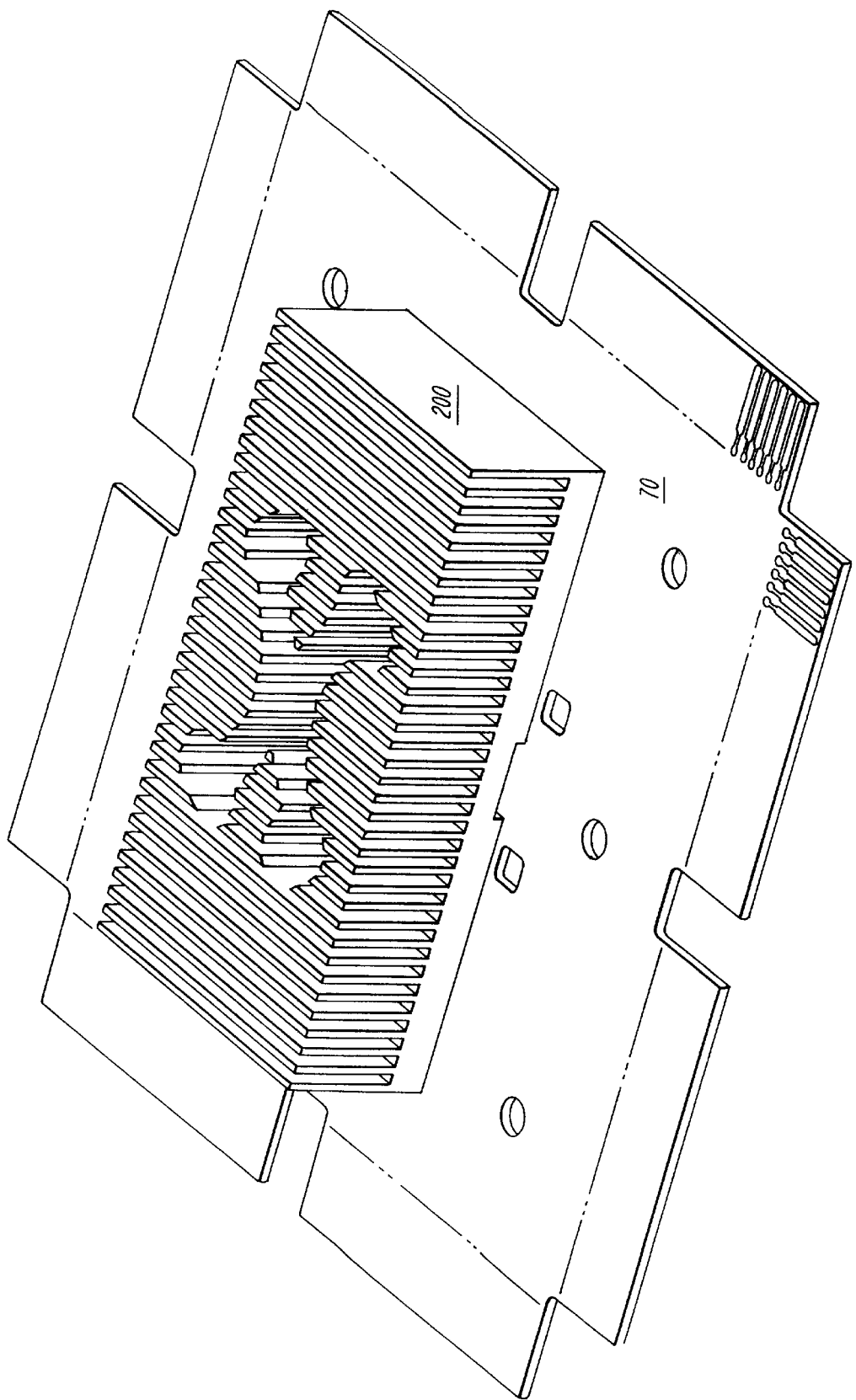
FIG. 7D is a perspective view of the heat sink of FIG. 7A assembled on a circuit board.

Referring now to FIGS. 7A through 7D a clamp mechanism is shown that includes a heatsink 200 having a plurality of fins 210 extending therefrom. The plurality of fins provides additional cooling. The fins include the cavity 240 for the spring assembly (not shown). The heatsink 200 further includes a slot 220 on the bottom side thereof which is sized to fit over a thermal pad 201 and an upper portion of the LGA or similar type device 90. As shown in FIG. 7C, the slot 220 extends the entire width of the heatsink 200. Slot 220 allows more of the bottom surface area of the heatsink 220 to contact the device 90 and as a result provides for increased cooling of the LGA or similar electronic device 90. FIG. 7D shows the entire assembly incorporating the heatsink 200 installed on a circuit board 70. The inclusion of fins 210 and slot 220 provides for additional cooling, thereby allowing the device to be run at higher speeds.

Figure 8:
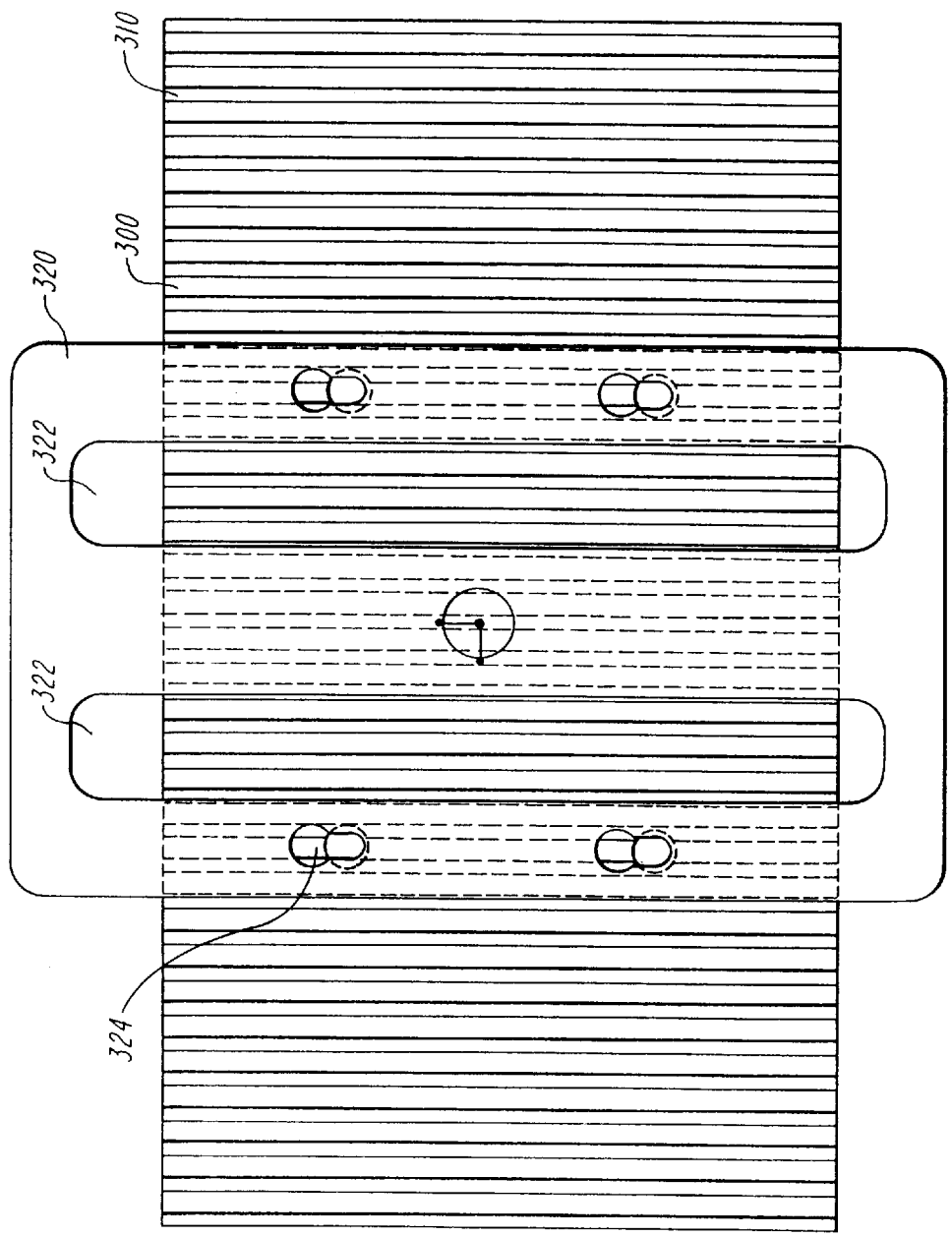
FIG. 8 is a top view of another embodiment of a clamp mechanism assembly.

Referring now to FIG. 8 an additional spring assembly/ heatsink combination is shown. In this embodiment, the heatsink 300 also includes a plurality of cooling fins 310. Spring 320 has a generally rectangular shape an includes a pair of cutouts 322. Spring 320 also includes four slotted openings 324 for receiving the heads of the mounting posts therein. A first portion of the slotted opening comprises a first diameter hole which has a larger diameter than the head of the mounting post, so that the head of the mounting post can received through the first portion of the slotted opening. A second portion of the slotted opening includes a second diameter hole that is smaller than the head of the mounting post, but larger than the shank of the mounting posts. The four slotted opening are aligned on the spring 320 such that the spring is fit over the heads of the mounting posts, then the spring is slid such that the smaller portions of the mounting holes can be positioned under the mounting heads, thereby securing the spring and heatsink to the remainder of the clamp assembly.

Figure 9A:
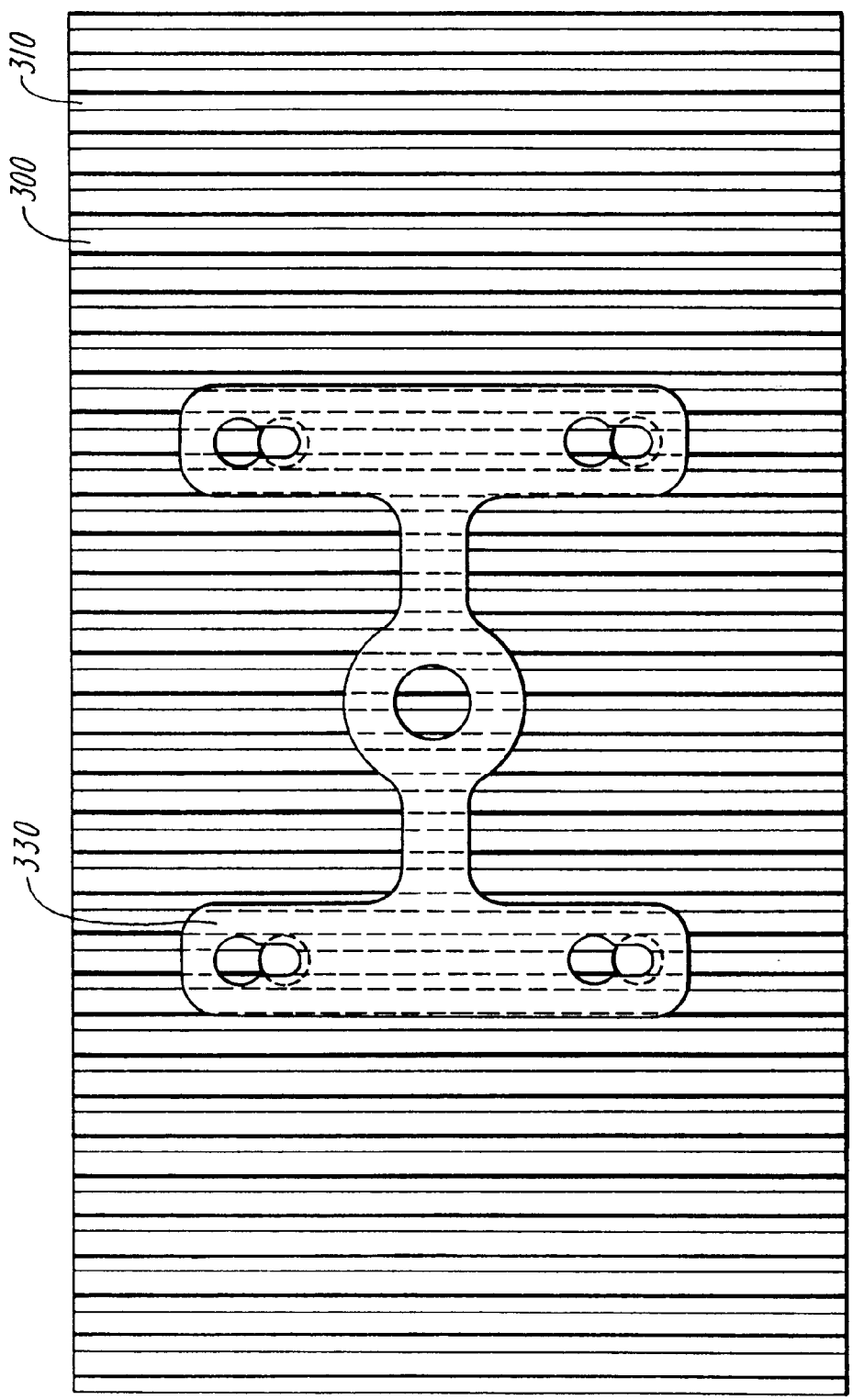
FIG. 9A is a top view of a further embodiment of a clamp mechanism assembly.
Figure 9B:
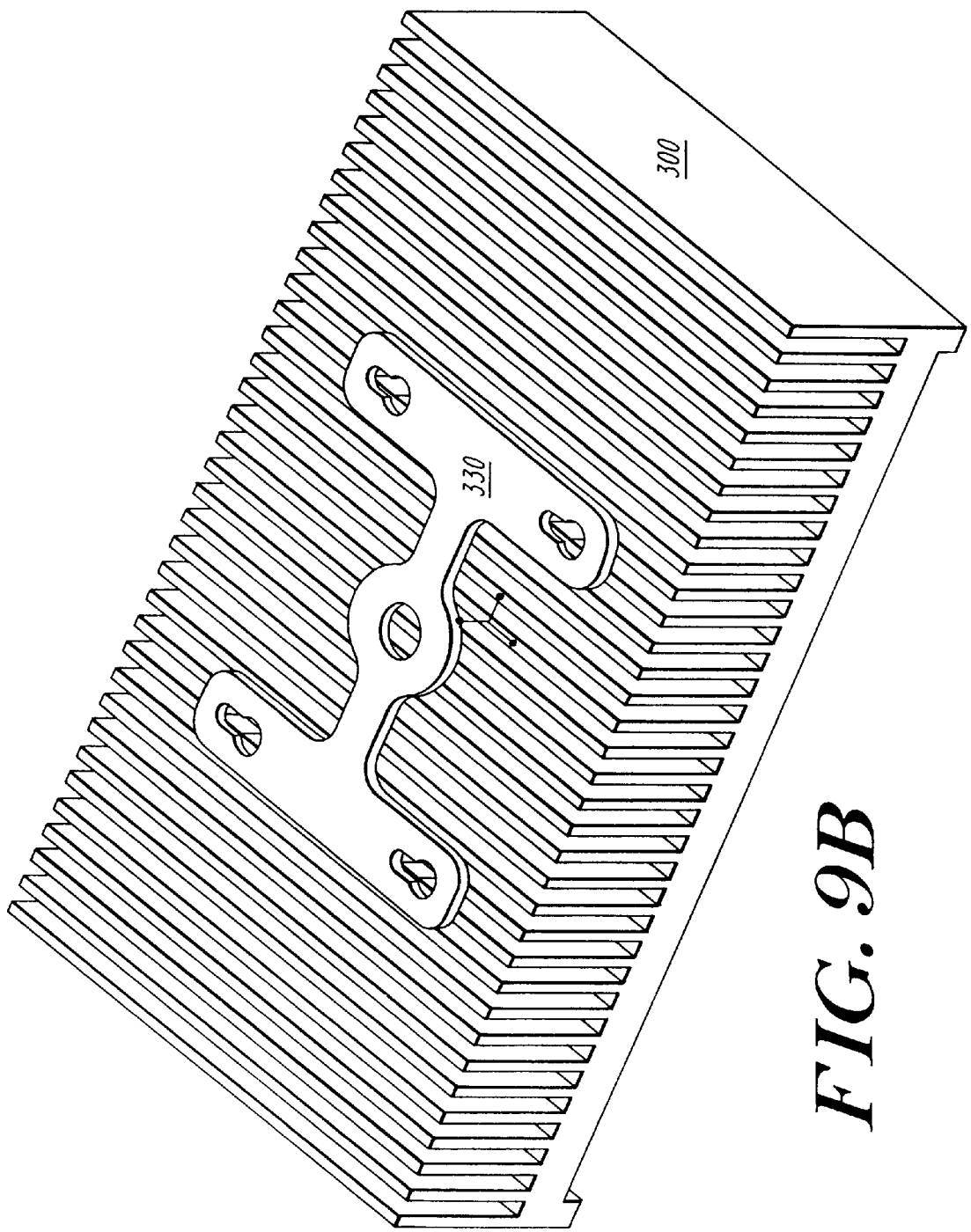
FIG. 9B is a perspective view of the heatsink and spring assembly of FIG. 9A.

Referring now to FIGS. 9A and 9B, a further embodiment of a spring is shown. Here, spring 330 is generally H-shaped. The spring operates in a similar manner as the spring described in FIG. 8, includes similar slotted openings and is installed in a similar manner. When installed, spring 330 cover less of the heatsink 300 and heatsink fins 310 and does not extend beyond the outer edges of the heatsink 300.

Figure 10A:
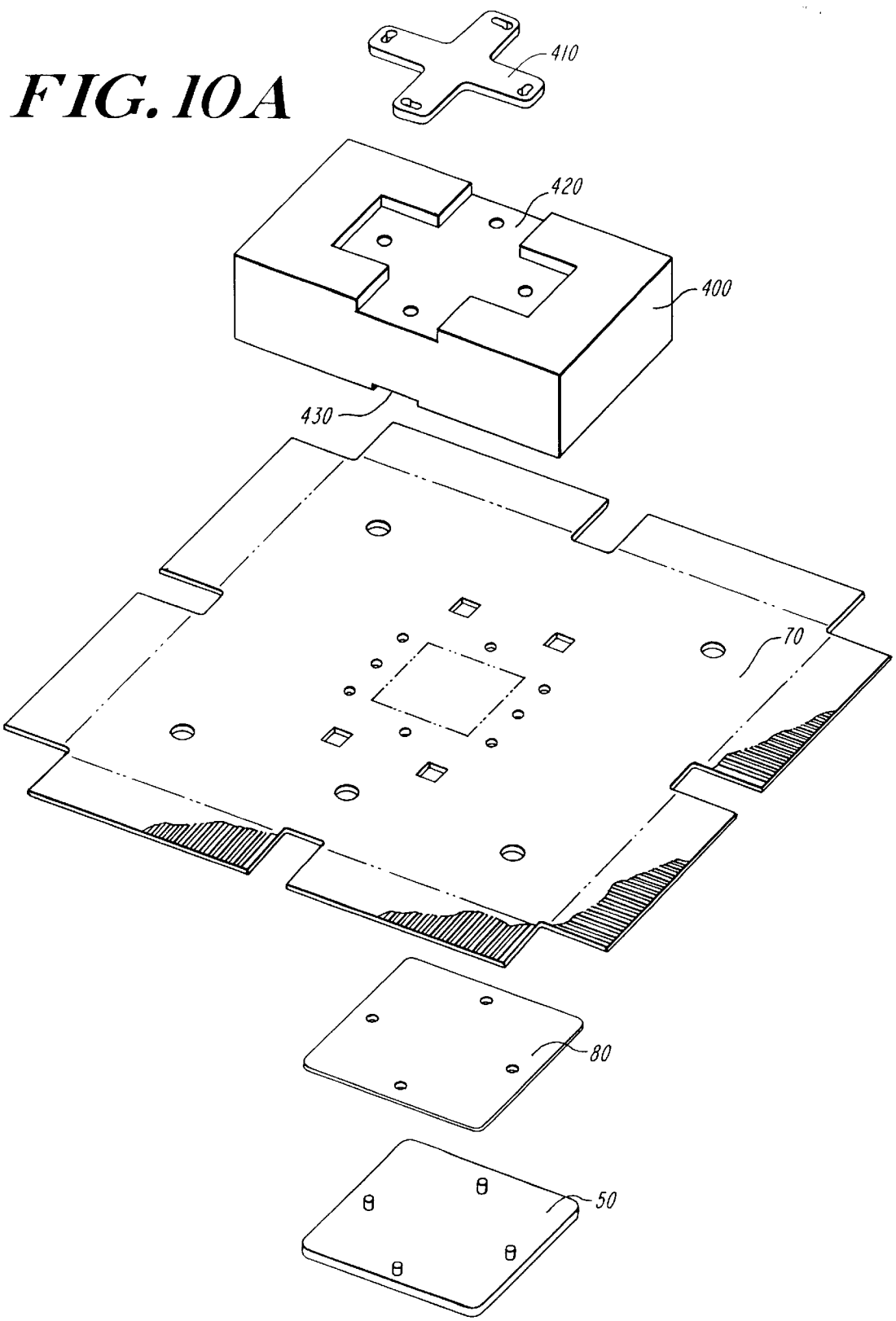
FIG. 10A is an exploded perspective view of another embodiment of a clamp mechanism assembly.
Figure 10B:
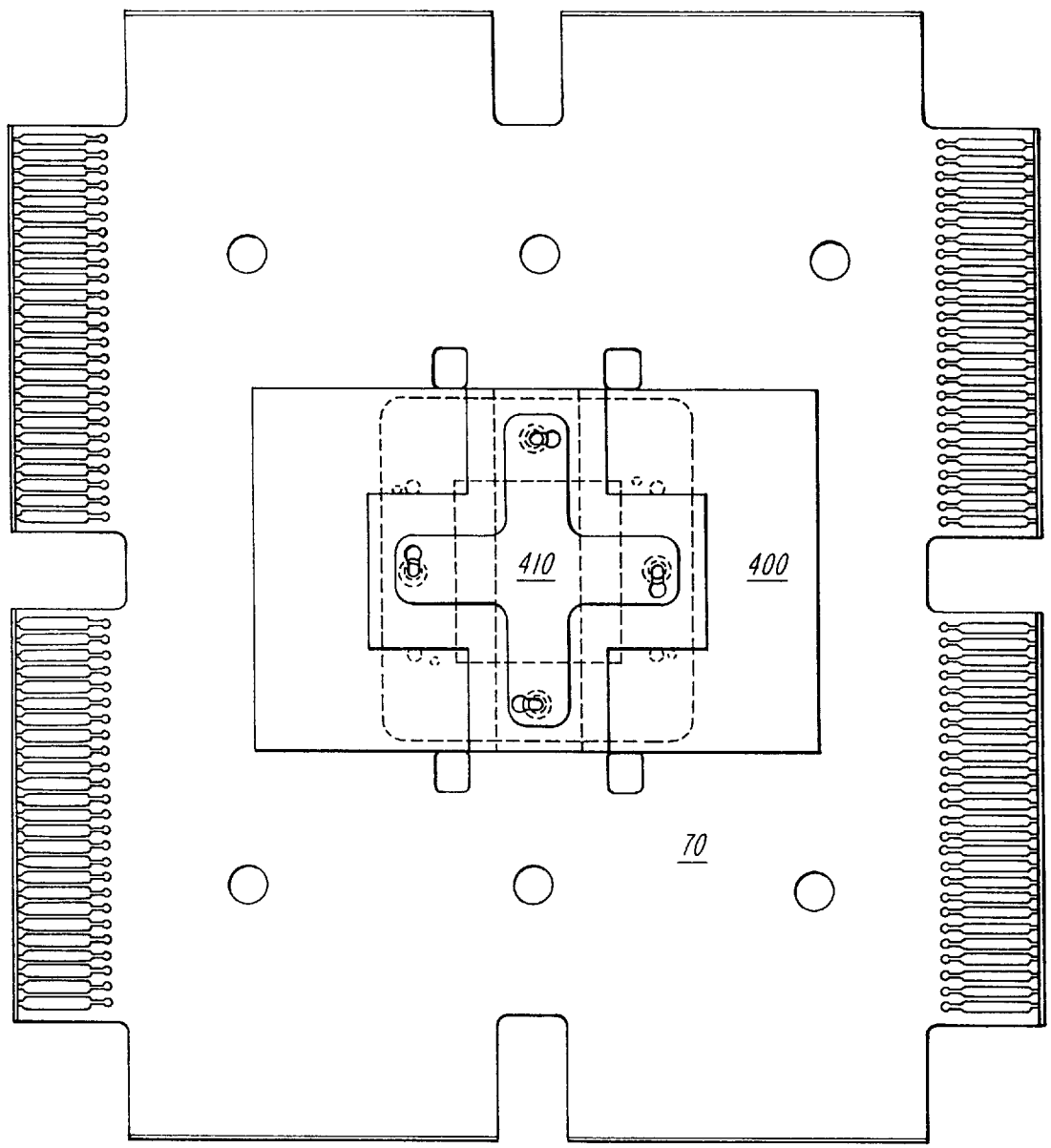
FIG. 10B is a top view of the clamp assembly mechanism of FIG. 10A.
Figure 11A:
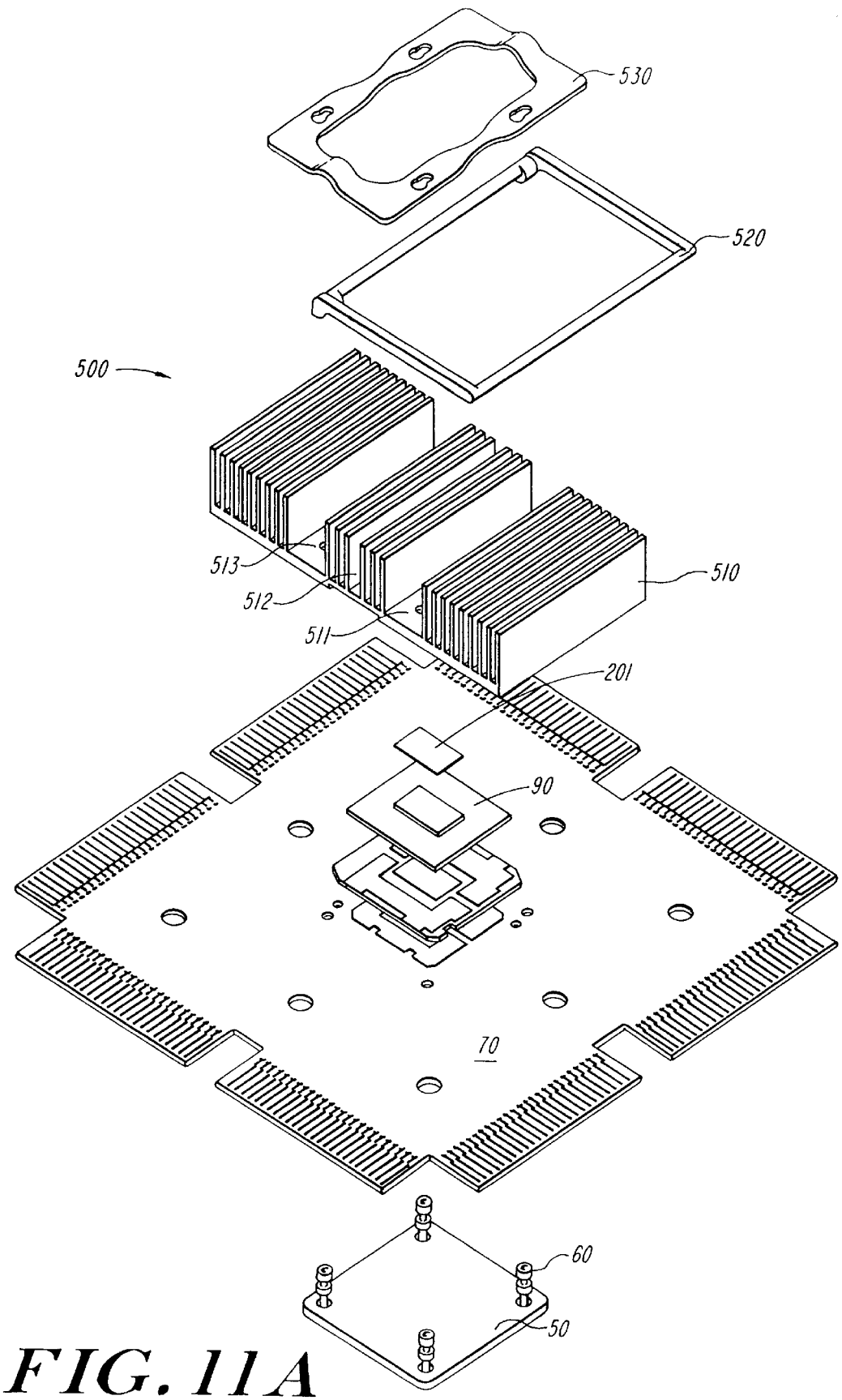
FIG. 11A is an exploded perspective view of another embodiment of a clamp mechanism assembly.
Figure 11B:
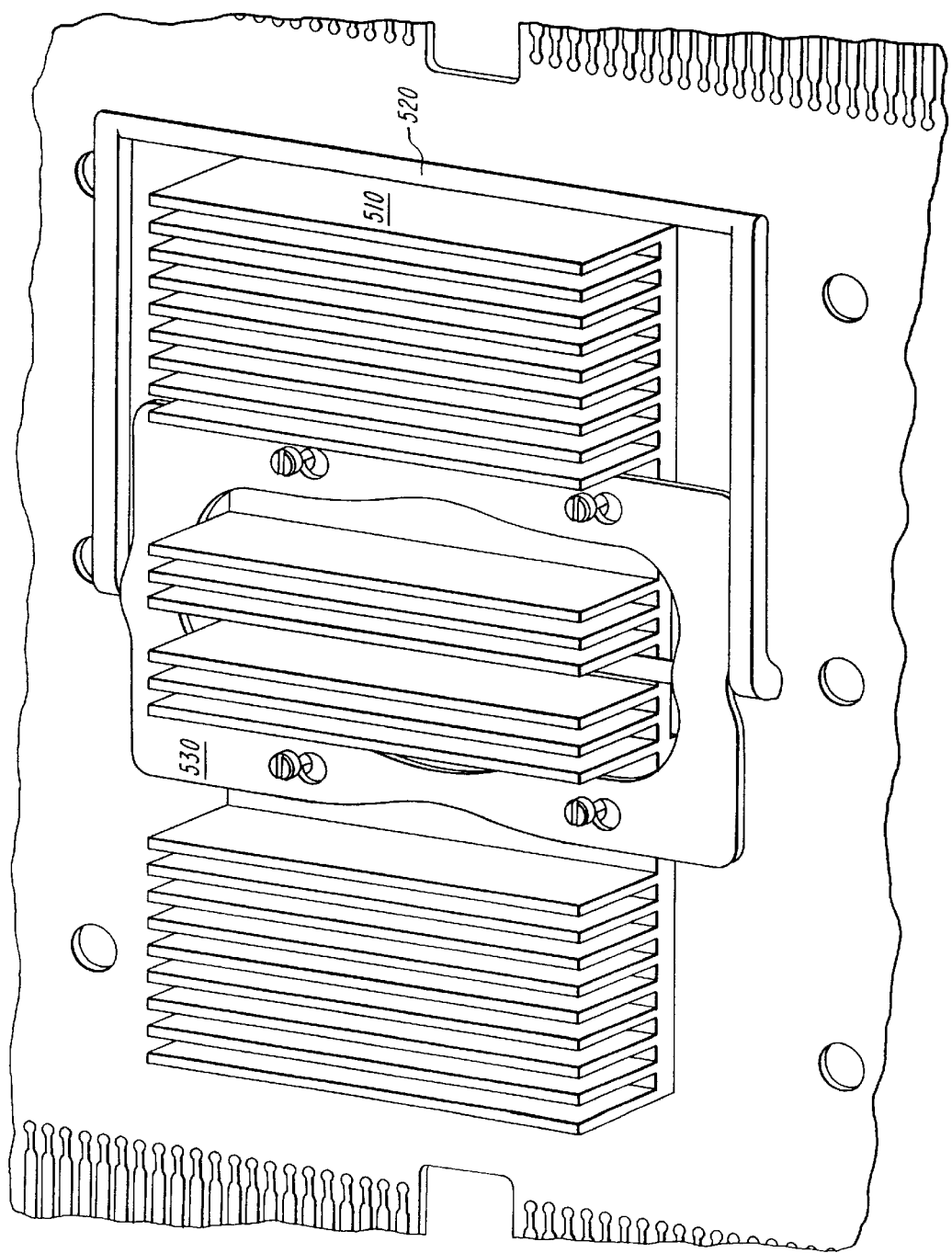
FIG. 11B is a perspective view of the clamp assembly of FIG. 11A.
Figure 11C:
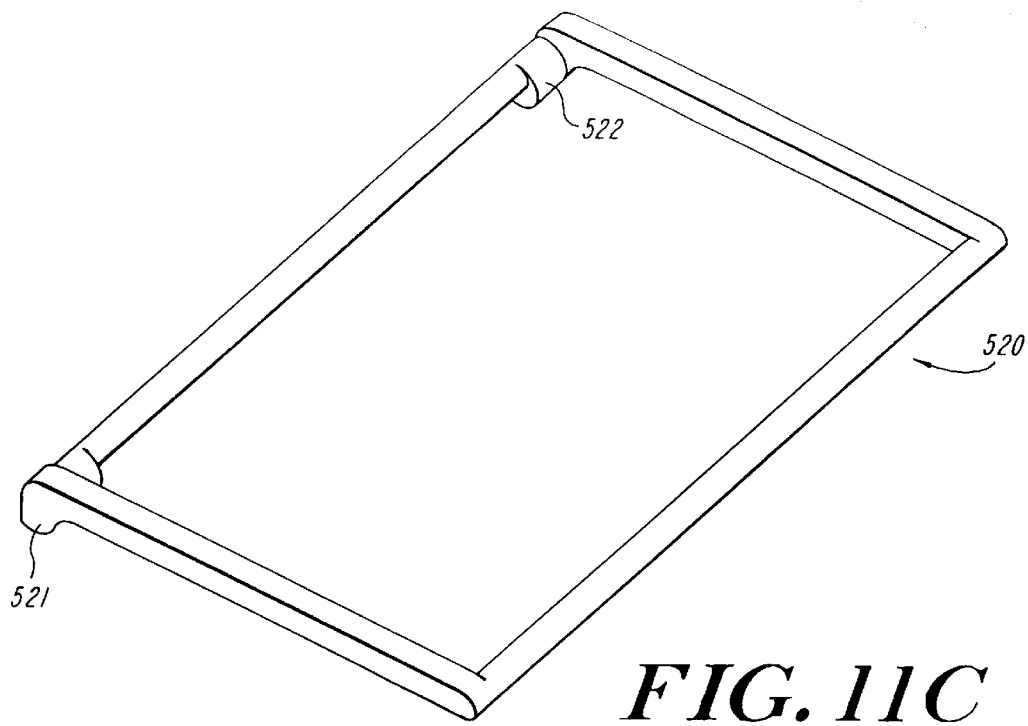
FIG. 11C is a diagram of the lever of the clamp assembly of FIG. 11A.
Figure 11D:
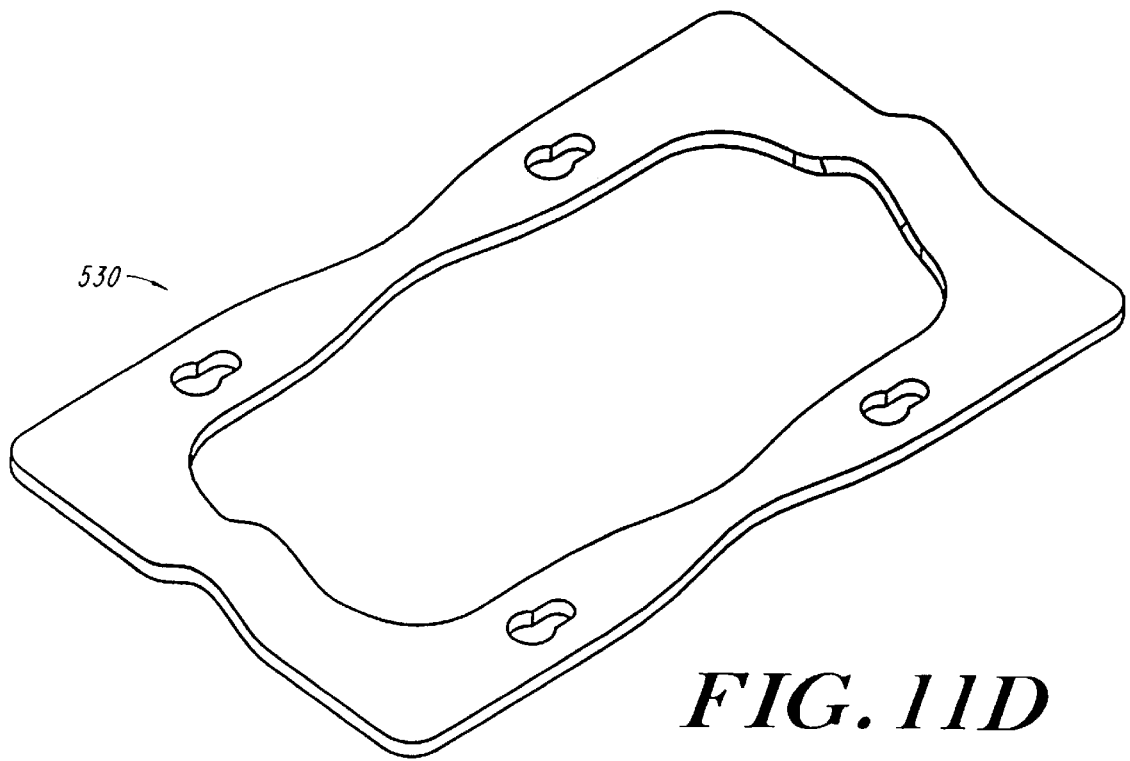
FIG. 11D is a diagram of the spring of the clamp assembly of FIG. 11A.

FIGS. 10A and 10B show an additional embodiment of a spring clamp mechanism. Heatsink 400 is shown as a rectangular block of material, though a finned heatsink could also be used. Heatsink 400 includes a generally cross-shaped cavity 420 disposed within the top surface of the heatsink 400. Here, the cross-shaped cavity extends along the entire width of the heatsink but in other embodiments the cavity need not span the entire width. Spring 410 is generally cross-shaped and includes a slotted opening at each distal end of the cross-shaped spring. Cavity 420 is configured to allow spring 410 to be inserted therein, and to fit over mounting posts (not shown). Cavity 420 is also configured so that the spring, after being fit over the heads of the mounting posts, may also be rotated to secure the spring 410 and heatsink 420 to the remainder of the assembly. Heatsink 400 may also include a slot 430 on a bottom surface that fits over the device and allows for more of the bottom surface of the heatsink to contact the device being cooled and thereby provide additional cooling.

Referring now to FIGS. 11A–11D a further embodiment of an LGA Clamp assembly 500 is shown. In this embodiment the heatsink 510 includes multiple sections 511, 512, and 513 which do not include fins. The spring assembly comprises a spring plate 530 and a spring lever 520. Spring plate 530 comprises a generally rectangular frame and includes two raised portions 531 and 532 for fitting over the spring lever 520. The spring lever 520 comprises a generally rectangular frame and includes at least one, and preferably two, cam surfaces 521 and 522 at two adjacent corners of the frame. When the assembly is installed on a device, the heatsink 510 is fit over the mounting posts 60 such that the heads of the mounting posts extend through the mounting holes of the heatsink. The spring frame lever 520 is installed such that the side of the frame which extends between the cam surfaces 521 and 522 is fit in to the middle section of the heatsink which does not have fins 512. The spring plate 530 is installed on the heatsink 510 such that the plate fits within two of the sections without fins 511 and 513 and fits over the mounting posts 60. The frame 530 is then positioned such that the openings fit under the heads of the mount posts 60. At this point the assembly has been installed, but is not biasing the heatsink against the device being cooled.

Figure 12A:
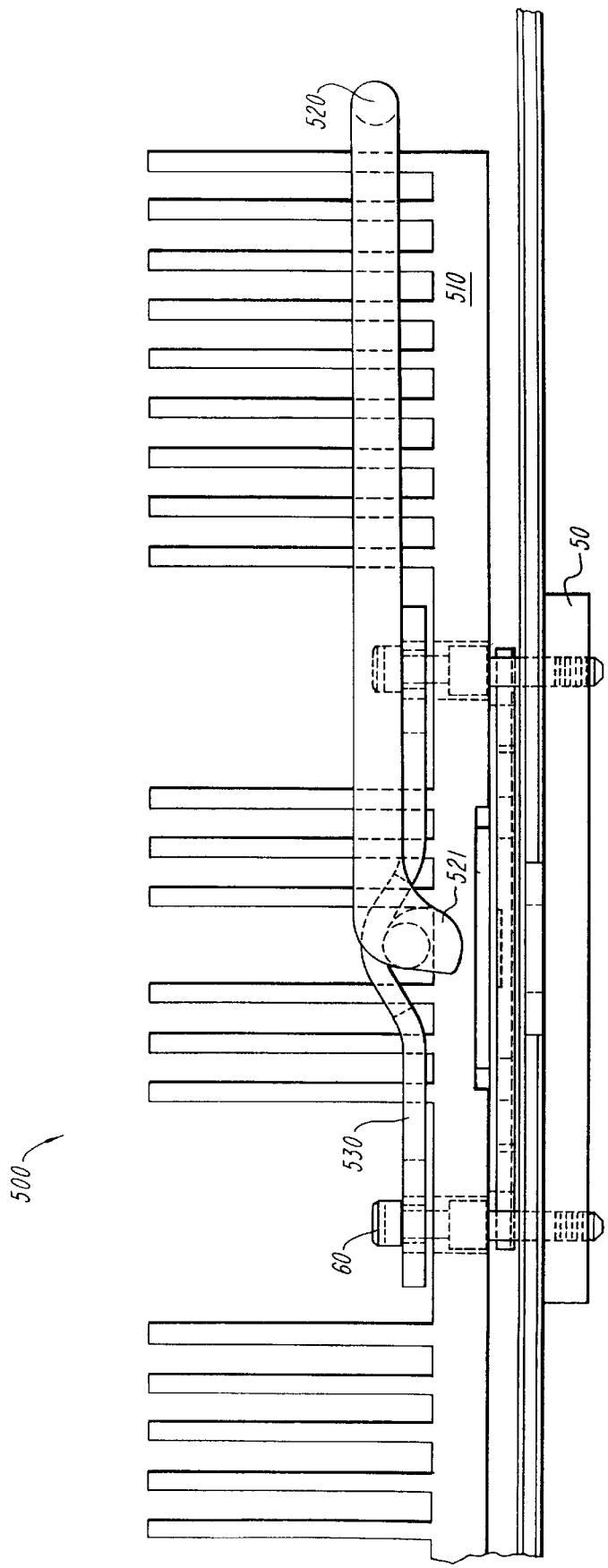
FIG. 12A is a view of the clamp apparatus of FIG. 11A in an unbiased position.
Figure 12B:
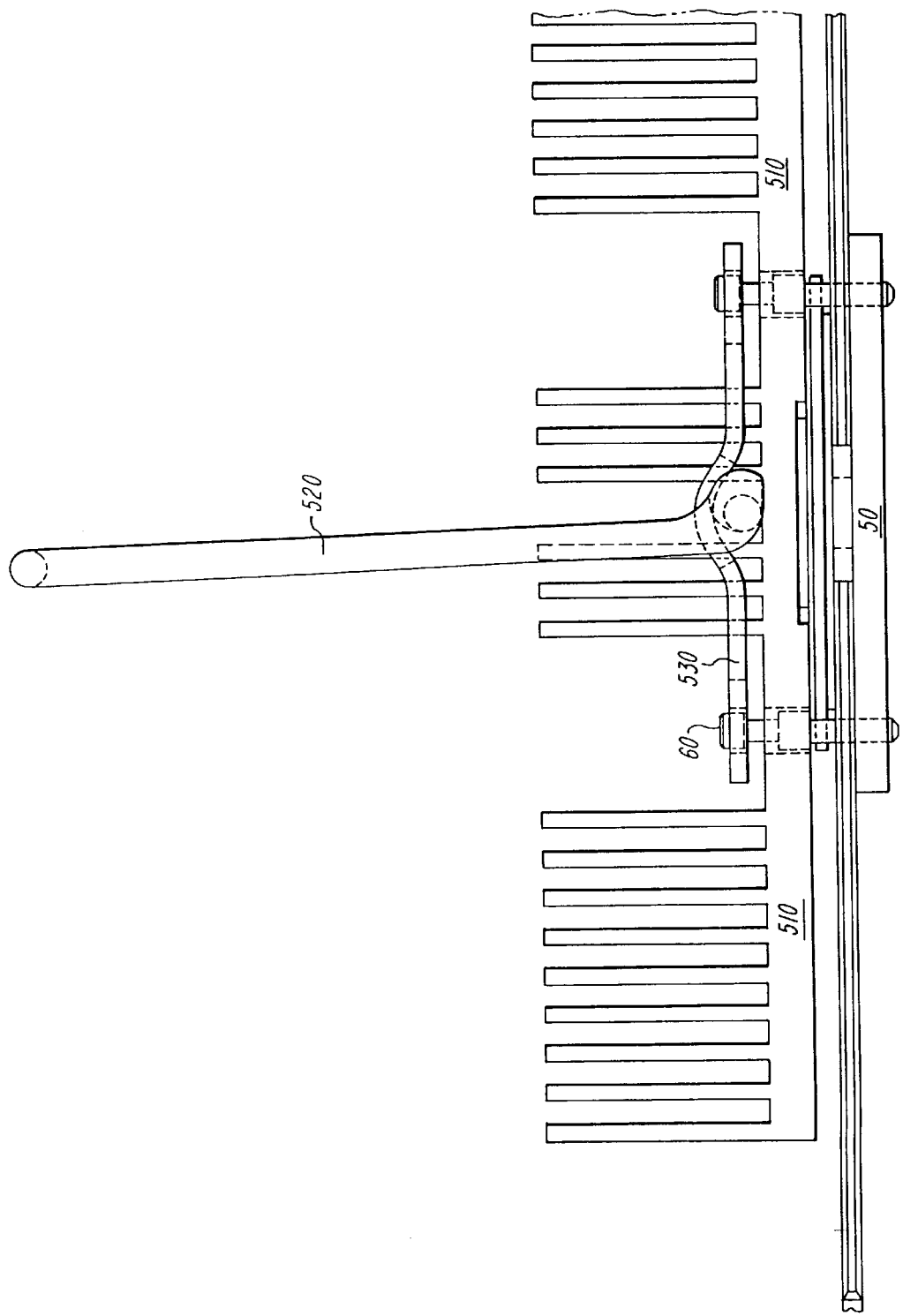
FIG. 12B is a view of the clamp assembly of FIG. 11A in a partially biased position.
Figure 12C:
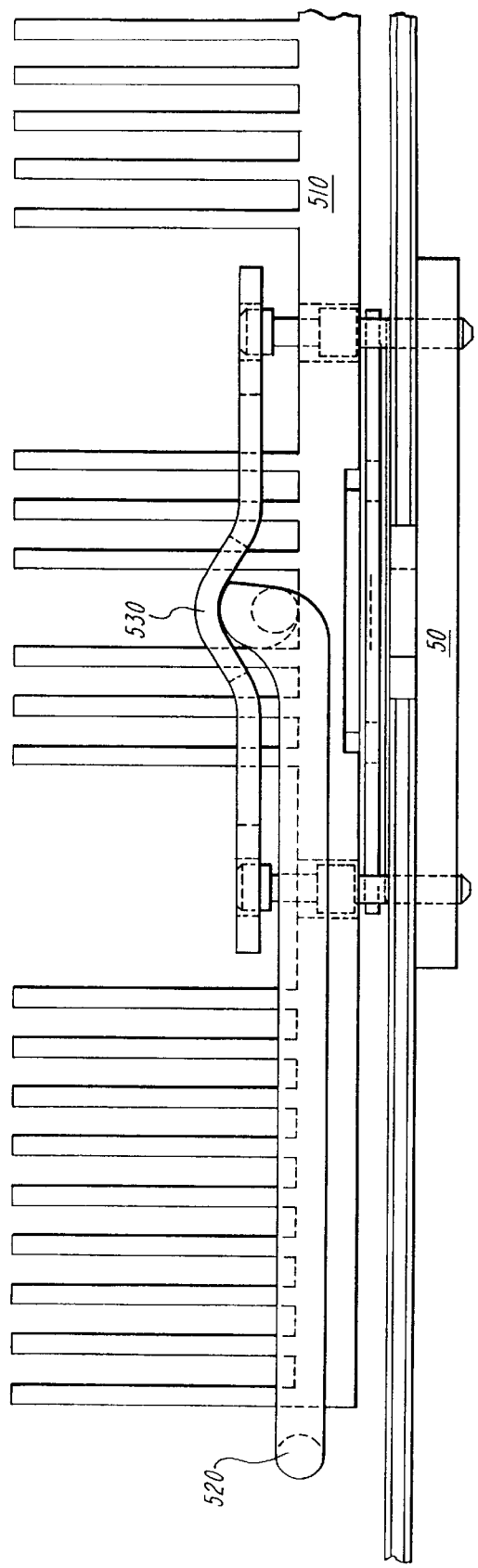
FIG. 12C is a view of the clamp assembly of FIG. 11A in a biased position.
Figure 13A:
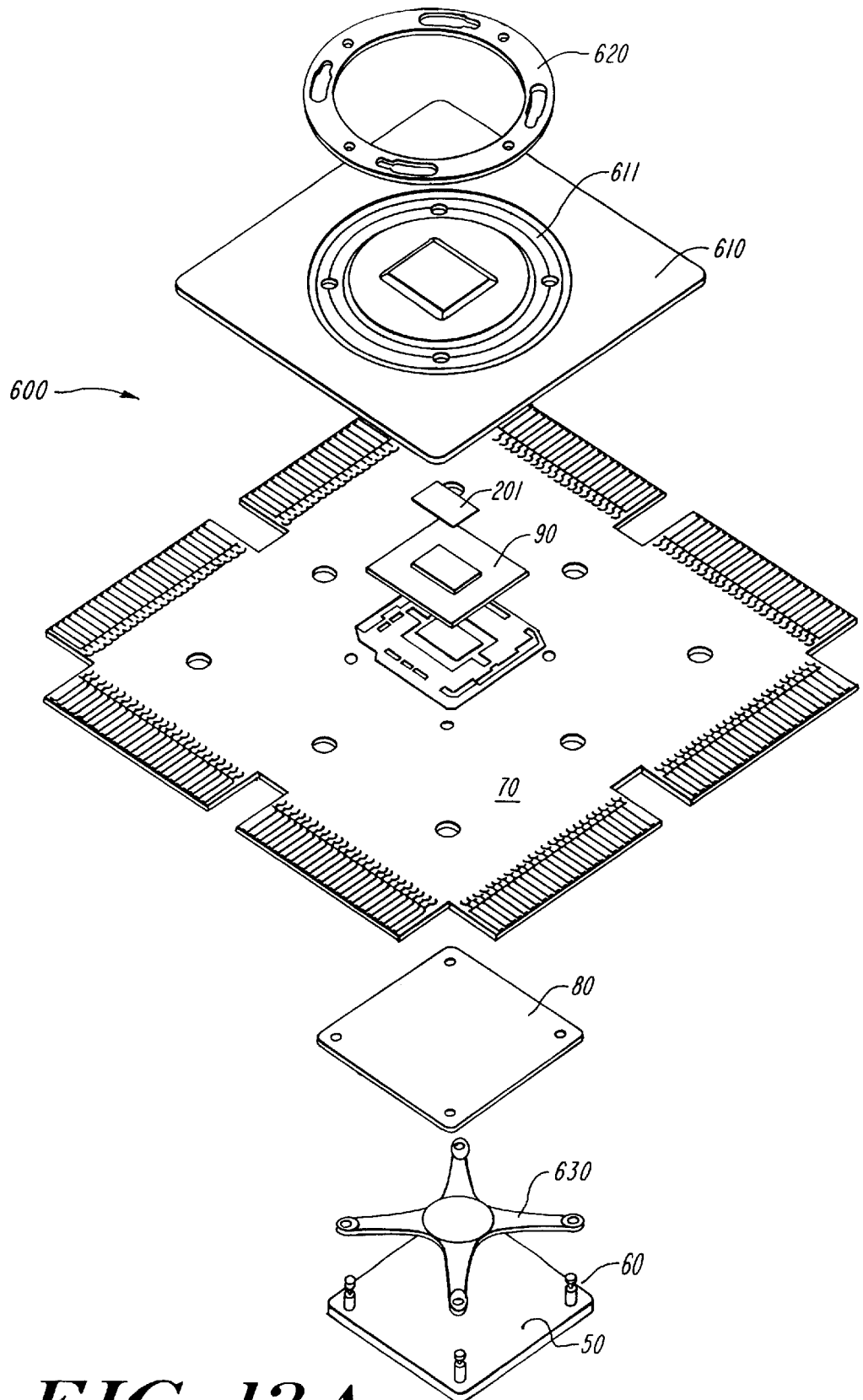
FIG. 13A is an exploded view of another embodiment of a clamp assembly.
Figure 13B:
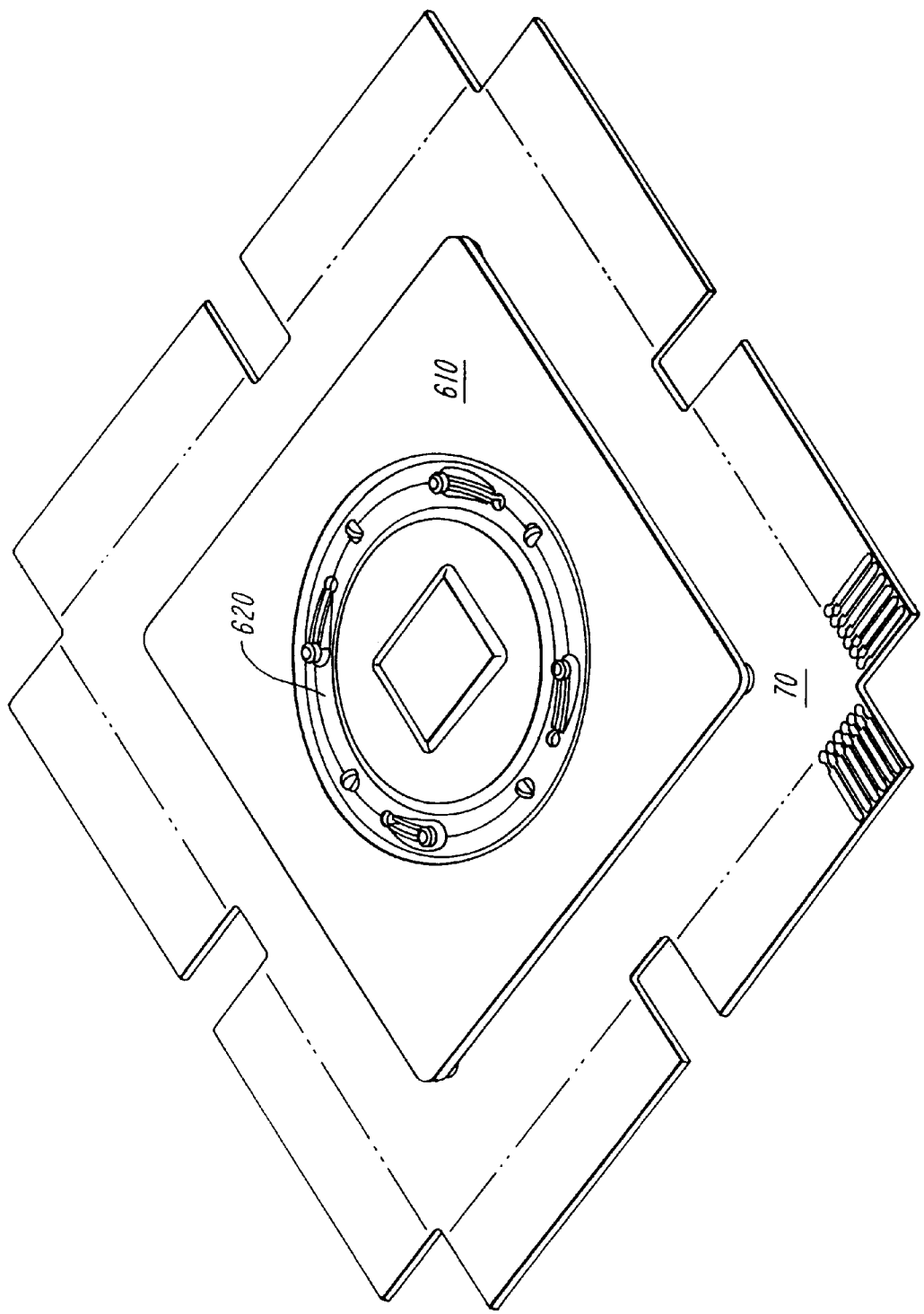
FIG. 13b is a perspective view of the clamp apparatus of FIG. 13A.
Figure 13C:
FIG. 13C is a cross-sectional side view of the clamp assembly of FIG. 13A.
Figure 13D:
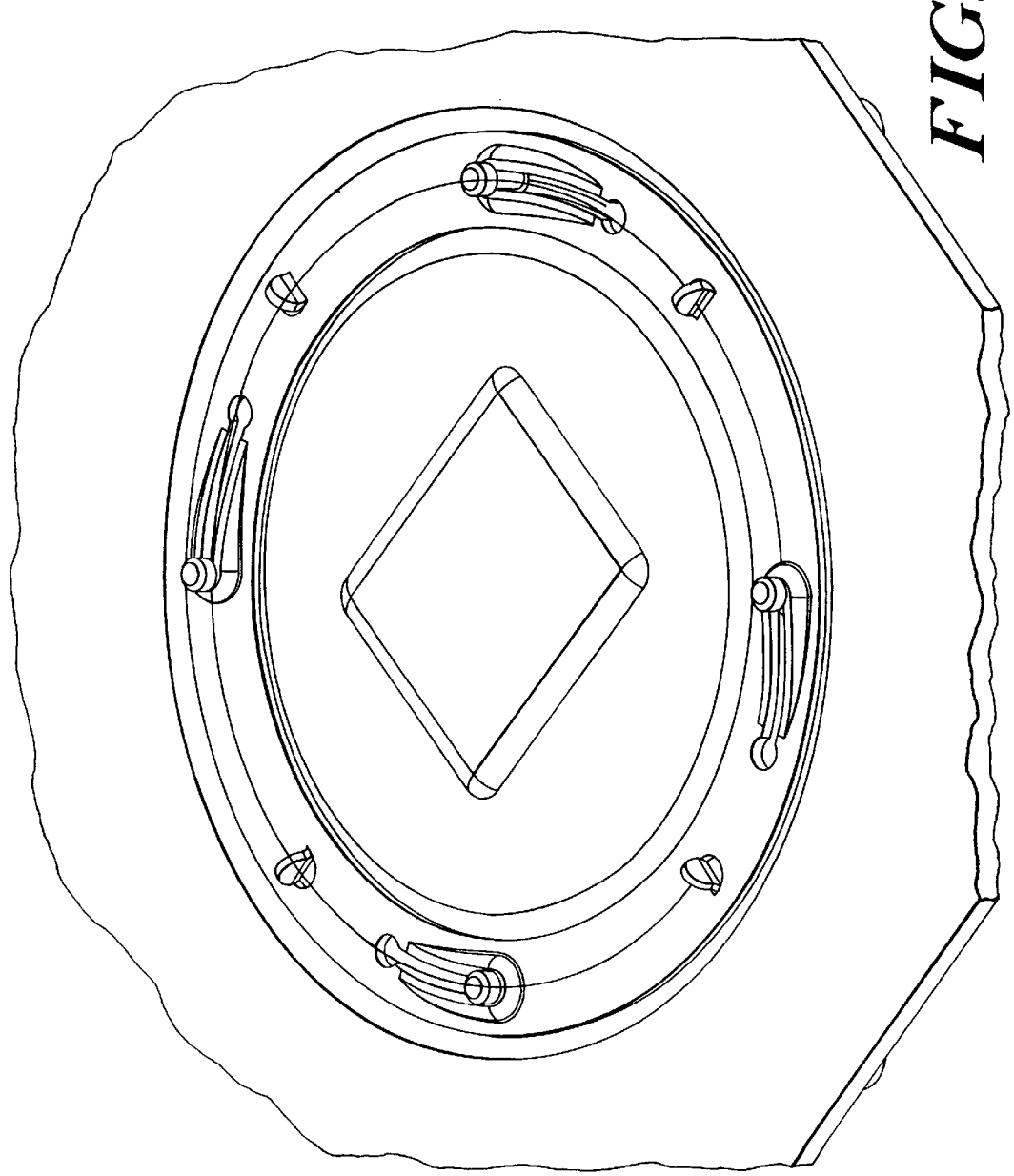
FIG. 13D is a partially broken way view of the spring assembly and spreader plate of the clamp assembly of FIG. 13A.

Referring now to FIGS. 12A through 12C the operation of engaging the heatsink is shown. At a first initial position, the heatsink 510 is not being biased against the device. As spring lever 520 is moved from this first position to a second position, the cam surface 521 engages the raised portion 532 of the spring plate sand provides a biasing mechanism by forcing the spring plate 530 away from the heatsink and against the bottom of the mounting post heads, thus producing a biasing force against the heatsink and the device being cooled.

FIGS. 13A–13D show an additional embodiment of a clamp assembly for an LGA or similar device. In this embodiment 600 a low profile assembly is provided. Assembly 600 includes a backing plate 50, backing plate insulator 80, for installation with a module 70 including a device socket, device 90 and thermal pad 201 as described in other embodiments. This embodiment further includes a cross-shaped spring 630 which is installed between the backing plate and the module, a heat spreader plate 610 which acts as a heatsink and removes heat from the device 90, and a spring assembly 620 for biasing the spreader plate 610 against the device 90. The spreader plate 610 may include a recess for receiving the spring assembly 620 partially therein.

Referring now to FIG. 14, spring assembly 620 is shown as a ring that includes four slotted openings 621. The slotted openings 621 have a first end 622 of a first thickness. The second end 623 of the opening 621 has a different thickness than the first end 622 thereof. The second thickness is larger than the first thickness. In operation, when the ring 620 is placed on the mounting posts the ring 620 is then rotated. The change in thickness between the first end and second of the slot is a gradual change, thus there is a linear or ramped surface 624 between the first end 622 and the second end 623 of the opening 621. While rotating the ring 620 the change in thickness of the slot provides a bias against the spreader plate 610.

Figure 16A:
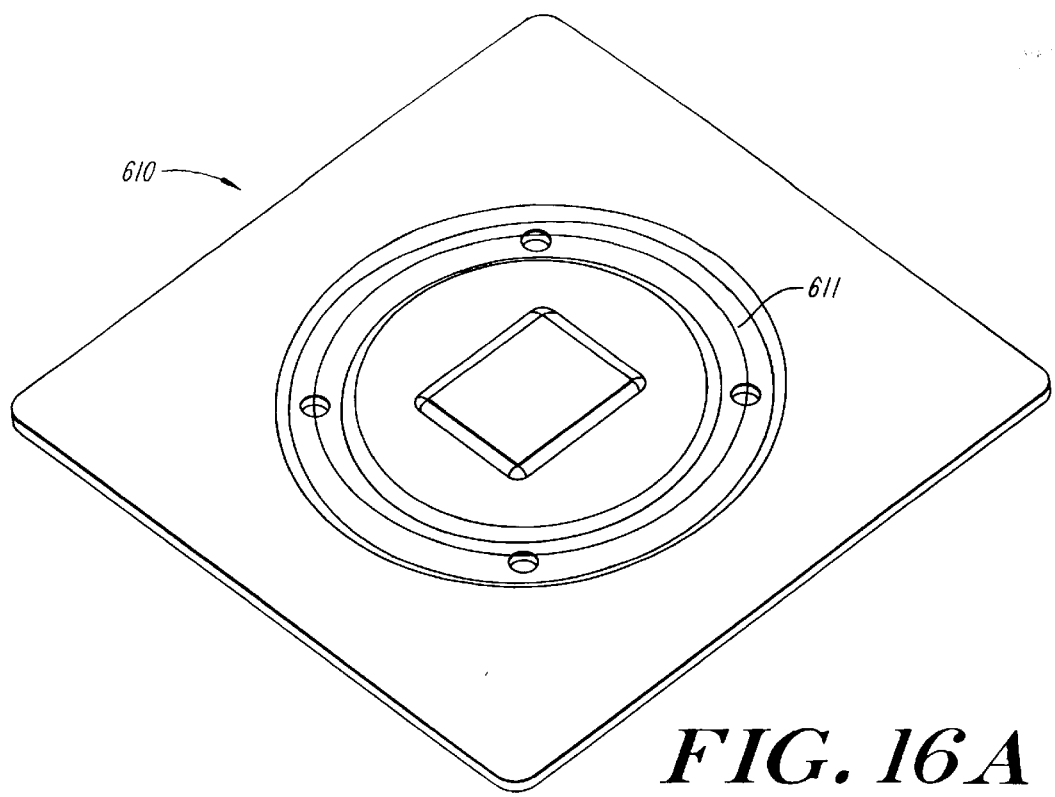
FIG. 16A is a top perspective view of the spreader plate of the clamp apparatus of FIG. 13A.
Figure 16B:
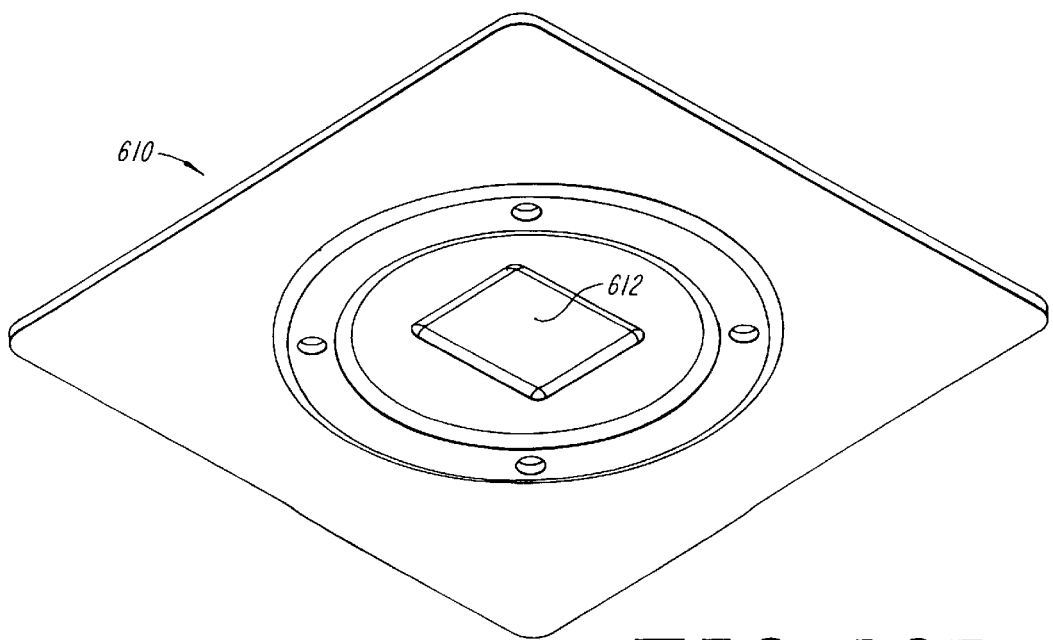
FIG. 16B is a bottom perspective view of the spreader plate of FIG. 16A.

The spring 630 is shown in FIGS. 15A and 15B. Spring 630 has a generally cross-shape, though other shaped springs could also be utilized. FIGS. 16A and 16B show the spreader plate 610. The spreader plate 610 removes heat from a device. Spreader plate 610 includes a first recess 612 for providing contact with the device being cooled or with a thermal pad. Spreader 610 also includes a second recess 611 for receiving the ring therein.

Referring now to FIGS. 17A–E an additional embodiment 700 of a clamp assembly is shown. This embodiment 700 includes a spring 710, an insulator 720 for installation with a module 70 including a device socket, device 90 and thermal pad 201 as described in other embodiments. This embodiment further includes a retaining ring 730, a captive ring 740 and a spreader 750.

Figure 17A:
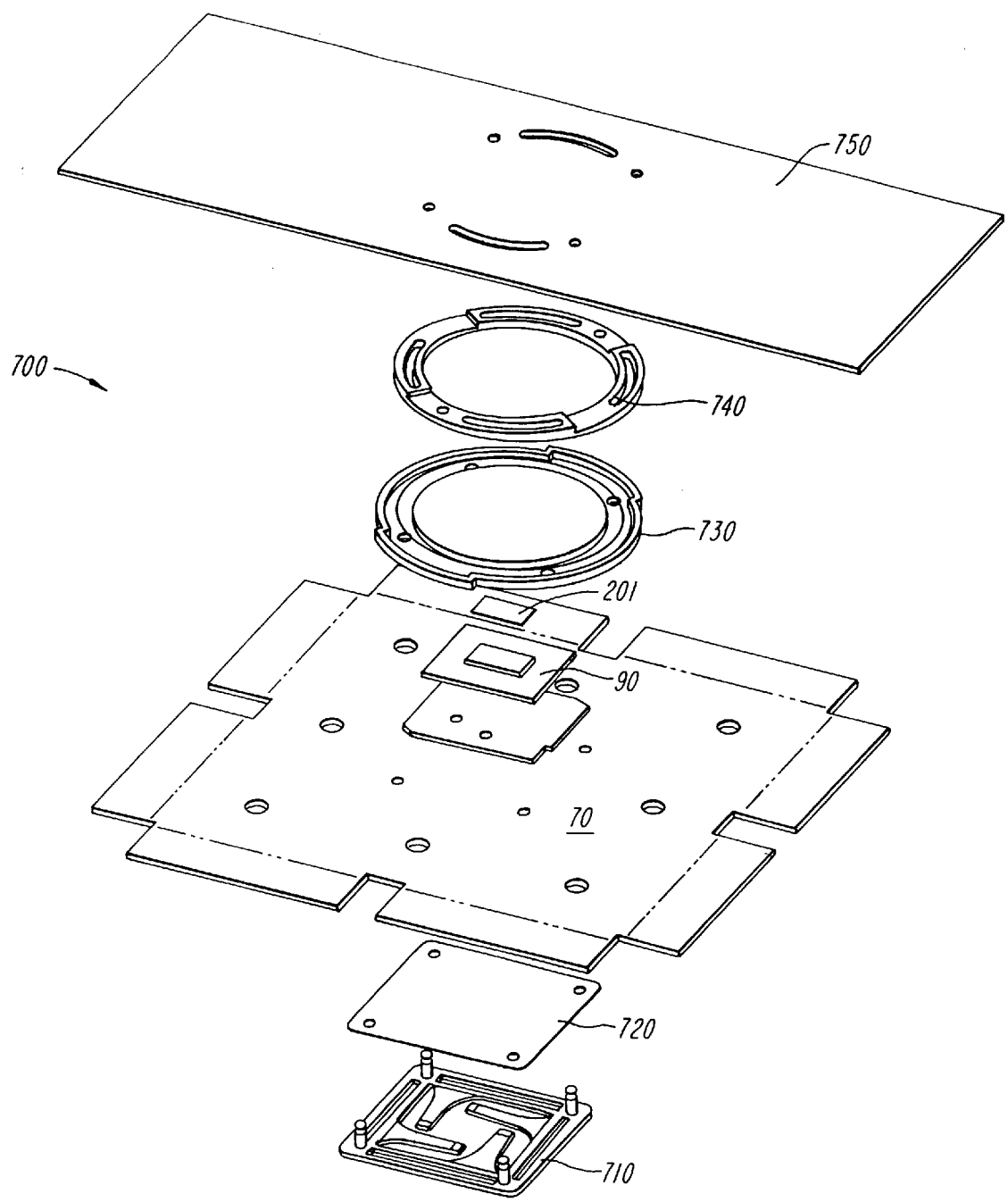
FIG. 17A is an exploded view of another embodiment of an LGA clamp assembly.
Figure 17B:
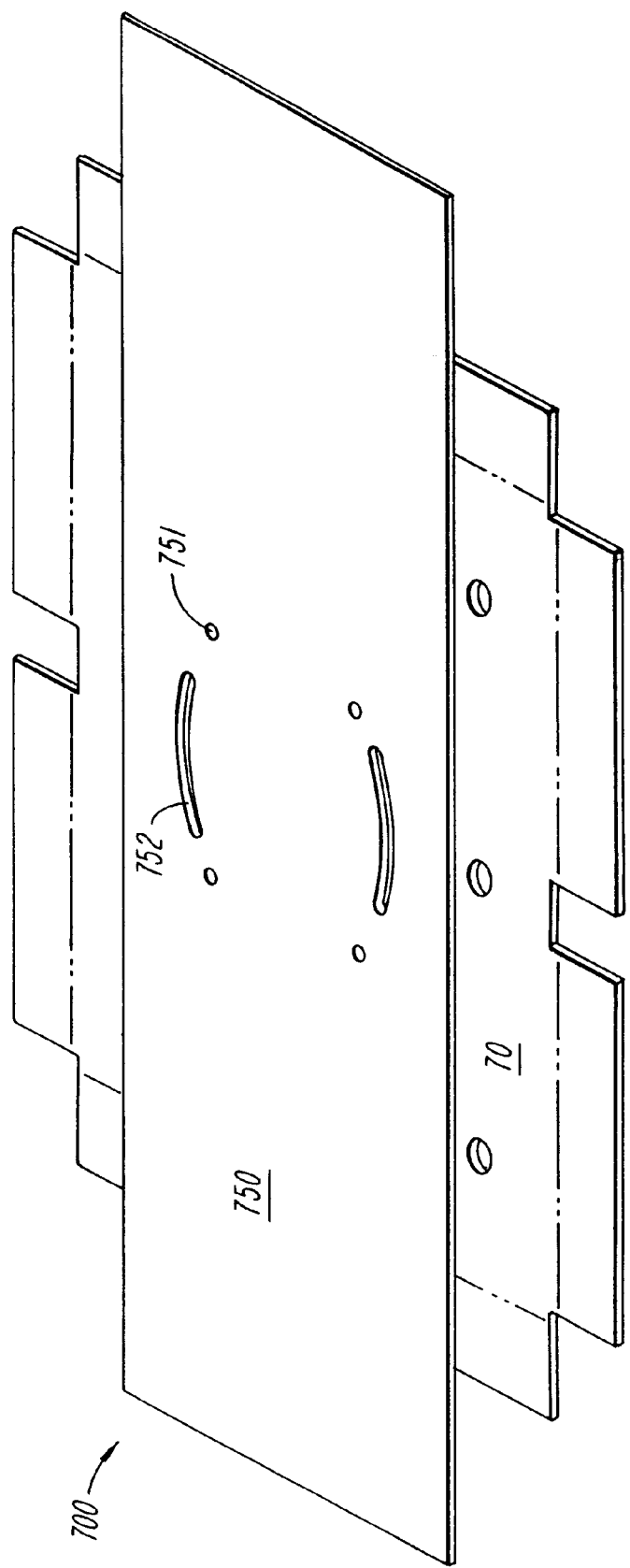
FIG. 17B is a perspective view of the clamp assembly of FIG. 17A.
Figure 17C:
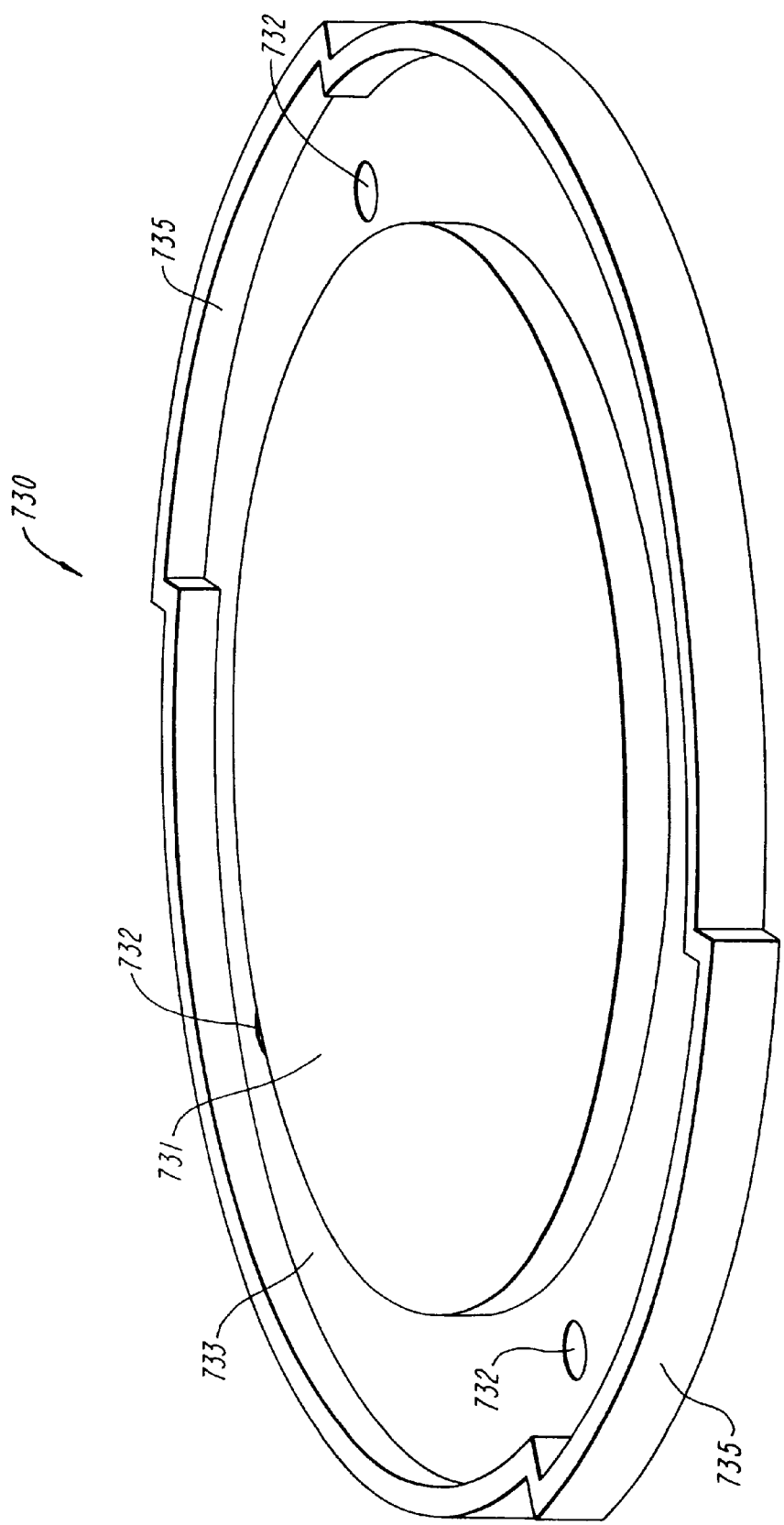
FIG. 17C is a perspective view of a retaining ring of the clamp assembly of FIG. 17A.

Referring now to FIG. 17C, retaining ring 730 is shown. The retaining ring 730 includes a raised central portion 731, a plurality of openings 732, a pair of extended sections 735 and an annular slot 733. Openings 732 receive the posts of spring 710 therethrough.

Figure 17D:
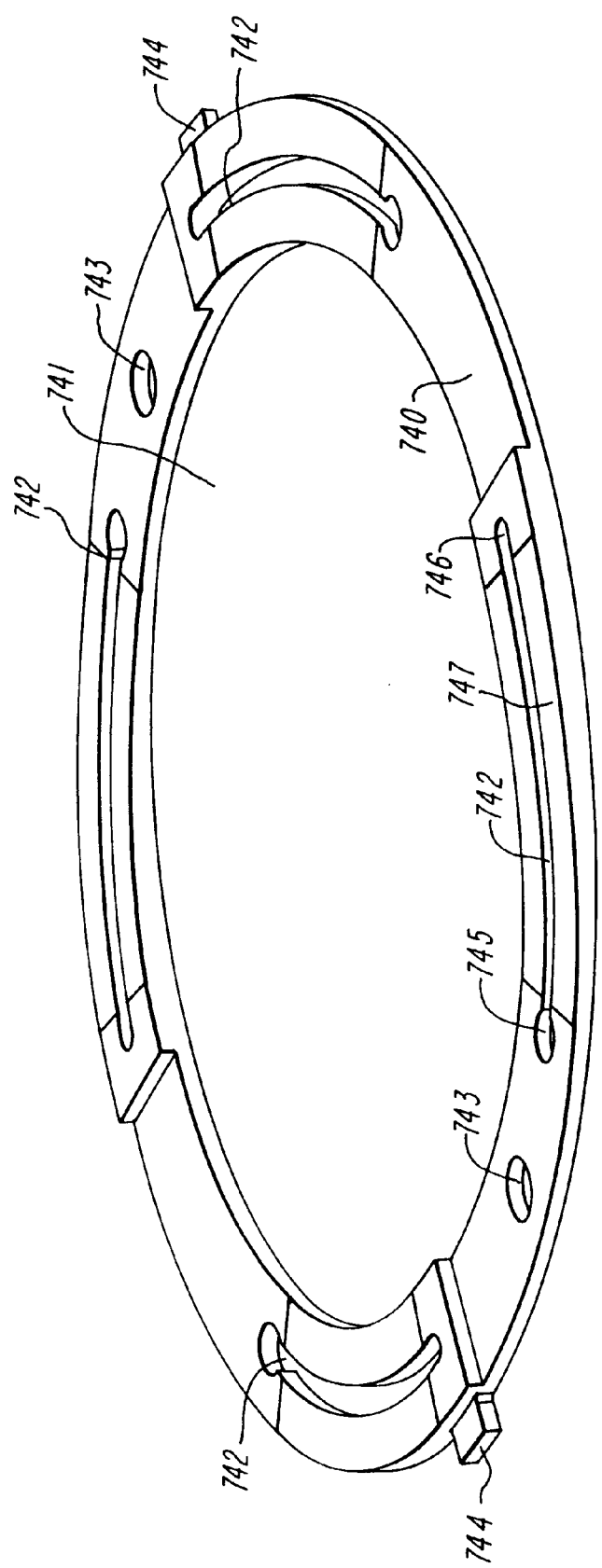
FIG. 17D is a perspective view of a captive ring of the clamp assembly of FIG. 17A.
Figure 17E:
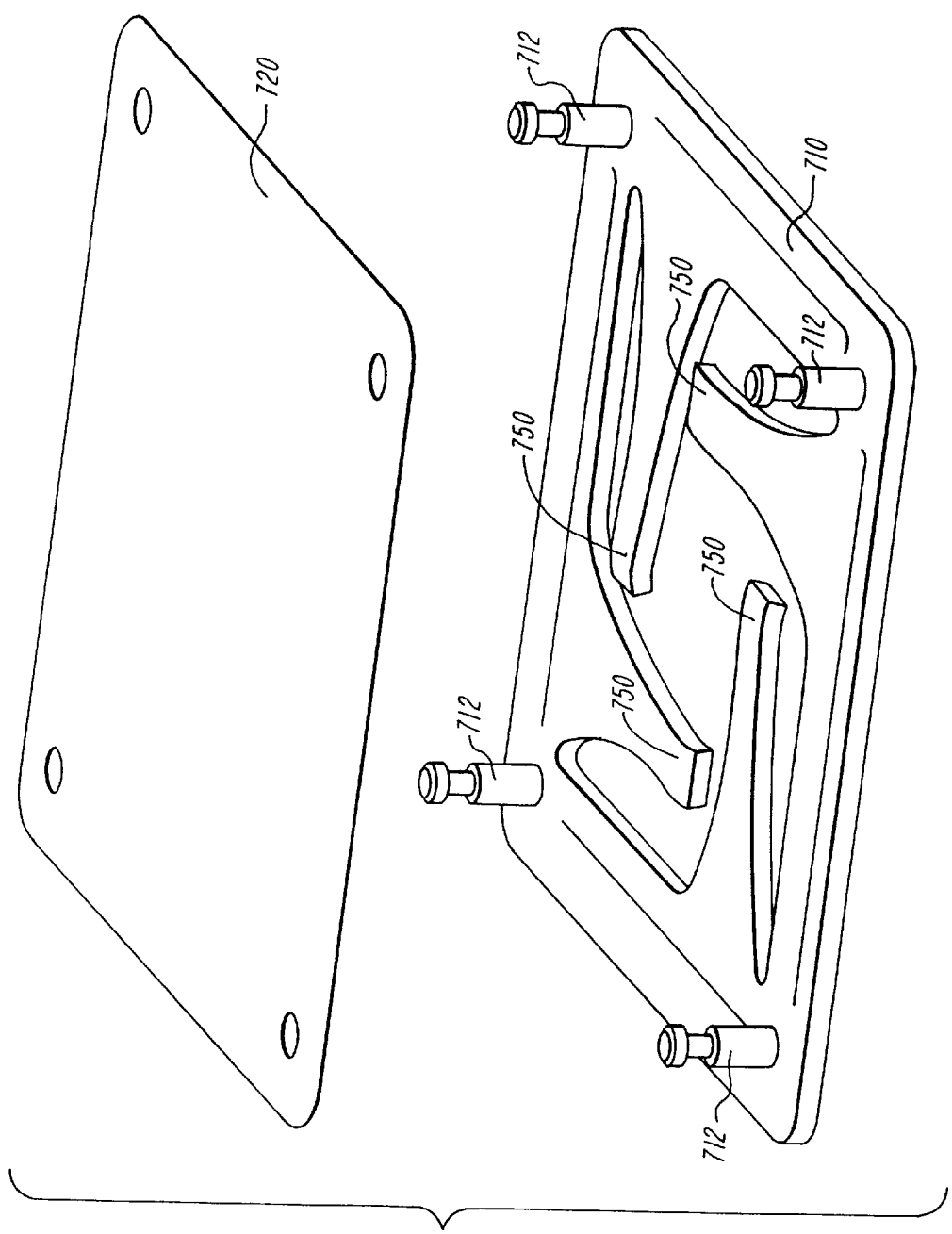
FIG. 17E is a perspective view of a spring and an insulator of the clamp assembly of FIG. 17A.

Captive ring 740 is shown in FIG. 17D. Captive ring 740 includes a central opening 741 that is configured to fit around the raised area 731 of retaining ring 730. Captive ring 740 further includes a plurality of slotted openings 742. The slotted openings 742 have a first end 745 of a first thickness. The second end 746 of the opening 742 has a different thickness than the first end 745 thereof. The second thickness is larger than the first thickness. In operation, when the captive ring 740 is placed on the mounting posts the ring

740 is then rotated. The change in thickness between the first end and second of the slot is a gradual change, thus there is a linear or ramped surface 747 between the first end 745 and the second end 746 of the opening 742. While rotating the captive ring 740 the change in thickness of the slot provides a bias against the retaining ring 730.

The captive ring is disposed within the annular slot 733 of retaining ring 730. The ears 744 of captive ring 740 are positioned within the extended sections of retaining ring 735. As such, captive ring is rotatable a certain degree of rotation within the retaining ring 730.

The spreader plate 750 fits over the captive ring 740 and retaining ring 730 and is physically attached to the raised portion of retaining ring 730, thus capturing the captive ring 740 rotatably within the retaining ring. When assembled, the captive ring 740, retaining ring 730 and spreader plate 750 are positioned over the posts 712 of spring 710. A tool engages the tool holes 743 of captive ring 740 through the slotted openings 752 of spreader plate 750 and is used to rotate captive ring 740, thus securing the spreader plate 750, captive ring 740 and retaining ring 730 to the posts 712 of spring 710. Beams 750 of spring 710 provide a force to bias the device 90 and thermal pad 201 against the retaining ring 730 and spreader plate 750.

The above described clamp mechanisms provide a desired uniform amount of pressure to a heatsink and an integrated circuit as well as being simple to assemble, install and adjust.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

I claim:

1. A clamp apparatus for an electronic device comprising:
   a backing plate having a first side and a second side, said backing plate including a plurality of posts extending from said first side, said backing plate capable of being mounted to a first side of a printed circuit board;
   a heartsink having a first surface and a second surface, said heartsink operative to remove heat from an electronic device abutting the first surface thereof; and
   a spring assembly removably secured to said posts of said backing plate, said spring assembly including a spring and a bias adjustment element operative to rotatably provide an adjustable, substantially uniform pressure to said heartsink and said electronic device.

2. The clamp apparatus of claim 1 further comprising a backing plate insulator disposed between the first side of said backing plate and a first side of a printed circuit board.

3. The clamp apparatus of claim 1 wherein said plurality of posts extending from said backing plate is removably attachable to said backing plate.

4. The clamp apparatus of claim 1 wherein said plurality of posts extending from said backing plate is integral with said backing plate.

5. The clamp apparatus of claim 1 wherein said spring includes a plurality of beams.

6. The clamp apparatus of claim 1 wherein said spring is generally X-shaped.

7. The clamp apparatus of claim 1 wherein said spring is generally rectangular in shape.

8. The clamp apparatus of claim 7 wherein said spring includes at least one cutout.

9. The clamp apparatus of claim 1 wherein said spring is generally H-shaped.

10. The clamp apparatus of claim 1 wherein said spring is generally cross-shaped.

11. The clamp apparatus of claim 1 wherein said second surface of said heatsink includes a cavity configured to receive said spring assembly therein.

12. The clamp apparatus of claim 7 wherein said cavity is generally X-shaped.

13. The clamp apparatus of claim 7 wherein said cavity is generally rectangular in shape.

14. The clamp apparatus of claim 7 wherein said cavity is generally H-shaped.

15. The clamp apparatus of claim 7 wherein said cavity is generally cross-shaped.

16. The clamp apparatus of claim 1 wherein said heatsink includes a plurality of fins.

17. The clamp apparatus of claim 1 wherein said heatsink includes a slot disposed within said first surface.

18. The clamp apparatus of claim 1 wherein said heatsink comprises a spreader plate.

19. The clamp apparatus of claim 1 wherein said heatsink comprises aluminum.

20. The clamp apparatus of claim 2 wherein said backing plate insulator comprises MYLAR.

21. The clamp apparatus of claim 1 wherein said backing plate comprises generally rigid material.

22. The clamp apparatus of claim 21 wherein said generally rigid material comprises steel.

23. The clamp apparatus of claim 1 wherein said posts comprise generally rigid material.

24. The clamp apparatus of claim 23 wherein said generally rigid material comprises steel.

25. The clamp apparatus of claim 1 further comprising an electronic device socket operative to receive an electronic device therein, said electronic device socket disposed between said heatsink and said backing plate.

26. The clamp apparatus of claim 1 wherein said heatsink includes a plurality of sections which do not have fins, wherein at least a portion of said spring assembly is configured to fit within at least one of said heatsink sections which do not have fins, and wherein said bias adjustment element comprises a lever including a cam portion received between said spring and said heatsink, said lever movable from a first position wherein said spring is not biasing said heatsink to a remainder of the clamp assembly to a second position wherein said spring is biasing said heatsink to the remainder of said clamp assembly.

27. The clamp apparatus of claim 26 wherein said spring is generally rectangular.

28. The clamp apparatus of claim 26 wherein said lever is generally rectangular.

29. The clamp apparatus of claim 26 wherein said spring includes a raised section for abutting said cam portion of said lever.

30. The clamp apparatus of claim 1 wherein said heatsink comprises a spreader plate, wherein said spring is disposed between said backing plate and said spreader plate, wherein said bias adjustment element includes a plurality of openings having a first thickness at a first end and a second thickness at a second end and wherein said second thickness is larger than said first thickness and wherein said bias adjustment element is movable from a first position wherein said first end of said opening is disposed between said spreader plate and said posts to a second position wherein said second end of said opening is disposed between said spreader plate and said posts.

31. The clamp apparatus of claim 30 wherein the difference in thickness from said first end of said openings to said second end of said openings is generally linear.

32. The clamp apparatus of claim 30 wherein said bias adjustment element is generally circular.

33. The clamp apparatus of claim 30 wherein said spreader plate includes a first recess for receiving said bias element therein.

34. The clamp apparatus of claim 30 wherein said spreader plate includes a second recess for receiving a portion of said device therein.

35. A clamp apparatus for an electronic device comprising:
- a backing plate having a first side and a second side, said backing plate including a plurality of posts extending from said first side, said backing plate including a spring assembly, said backing plate capable of being mounted to a first side of a printed circuit board;
- a retaining ring having a first side and a second side, said second side disposed against an electronic device, a first side having an annular slot disposed therein;
- a captive ring disposed within said retaining ring annular slot, said captive ring rotatable within said retaining ring, said captive ring including a plurality of slotted openings for receiving said mounting posts therethrough and a tool hole for receiving a tool therein; and
- a spreader plate having a first surface and a second surface, a first surface of said spreader plate in mechanical and thermal communication with said retaining ring, said spreader plate operative to remove heat from an electronic device abutting said retaining ring, said spreader plate included a slot for receiving a tool therethrough.

36. The clamp apparatus of claim 35 further comprising an insulator disposed between said backing plate and a module.

37. The clamp apparatus of claim 35 further comprising a thermal pad disposed between said electronic device and said retaining ring.

38. The clamp apparatus of claim 1 wherein said spring assembly is disposed adjacent the second surface of said heatsink.

39. The clamp apparatus of claim 1 wherein said bias adjustment element comprises one bias adjustment screw integrated with said spring assembly for providing the uniform pressure.

40. The clamp apparatus of claim 1 wherein said backing plate includes said spring assembly.

41. The clamp apparatus of claim 1 wherein said bias adjustment element comprises:
- a retaining ring having a first side and a second side, said second side disposed against said electronic device, a first side having an annular slot disposed therein; and
- a captive ring disposed within said annular slot of said retaining ring, said captive ring rotatable within said retaining ring, said captive ring including a plurality of slotted openings for receiving said posts therethrough and a tool hole for receiving a tool therein.

42. The clamp apparatus of claim 41 wherein said heartsink comprises a spreader plate having a first surface and a second surface, a first surface of said spreader plate in mechanical and thermal communication with said retaining ring, said spreader plate operative to remove heat from said electronic device abutting said retaining ring, said spreader plate including a slot for receiving a tool therethrough.

* * * * *